US009349590B2

(12) United States Patent
Hikosaka et al.

(10) Patent No.: US 9,349,590 B2
(45) Date of Patent: May 24, 2016

(54) METHOD FOR MANUFACTURING NITRIDE SEMICONDUCTOR LAYER

(75) Inventors: Toshiki Hikosaka, Kanagawa-ken (JP); Yoshiyuki Harada, Tokyo (JP); Hisashi Yoshida, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 13/604,183

(22) Filed: Sep. 5, 2012

(65) Prior Publication Data
US 2013/0237036 A1 Sep. 12, 2013

(30) Foreign Application Priority Data

Mar. 8, 2012 (JP) ................................. 2012-052343

(51) Int. Cl.
*H01L 21/02* (2006.01)
*H01L 33/00* (2010.01)
*H01L 33/12* (2010.01)

(52) U.S. Cl.
CPC ...... *H01L 21/02389* (2013.01); *H01L 21/0254* (2013.01); *H01L 21/02381* (2013.01); *H01L 21/02458* (2013.01); *H01L 33/007* (2013.01); *H01L 33/12* (2013.01)

(58) Field of Classification Search
CPC ..................................................... H01L 21/02
USPC ........................................................ 438/478
See application file for complete search history.

(56) References Cited

U.S. PATENT DOCUMENTS

| 7,319,064 | B2 | 1/2008 | Lee et al. | |
| 2003/0218181 | A1* | 11/2003 | Bader et al. | 257/102 |
| 2004/0119067 | A1* | 6/2004 | Weeks et al. | 257/40 |
| 2007/0057337 | A1* | 3/2007 | Kano et al. | 257/431 |
| 2011/0227033 | A1* | 9/2011 | Kushibe et al. | 257/13 |

(Continued)

FOREIGN PATENT DOCUMENTS

| CN | 102237403 A | 11/2011 |
| CN | 102237454 A | 11/2011 |

(Continued)

OTHER PUBLICATIONS

KR101105868B1 Machine translation from Korean to English created on Sep. 4, 2014, The Korean Intellectual Property Office, pp. 1-32.*

(Continued)

*Primary Examiner* — Dale E Page
*Assistant Examiner* — Lamont Koo
(74) *Attorney, Agent, or Firm* — Oblon, McClelland, Maier & Neustadt, L.L.P

(57) ABSTRACT

According to one embodiment, a method for manufacturing a nitride semiconductor layer is disclosed. The method can include forming a first lower layer on a major surface of a substrate and forming a first upper layer on the first lower layer. The first lower layer has a first lattice spacing along a first axis parallel to the major surface. The first upper layer has a second lattice spacing along the first axis larger than the first lattice spacing. At least a part of the first upper layer has compressive strain. A ratio of a difference between the first and second lattice spacing to the first lattice spacing is not less than 0.005 and not more than 0.019. A growth rate of the first upper layer in a direction parallel to the major surface is larger than that in a direction perpendicular to the major surface.

20 Claims, 10 Drawing Sheets

(56) References Cited

U.S. PATENT DOCUMENTS

| | | | |
|---|---|---|---|
| 2011/0244663 A1* | 10/2011 | Su | 438/478 |
| 2011/0266522 A1* | 11/2011 | Kim et al. | 257/22 |
| 2011/0266552 A1* | 11/2011 | Tu et al. | 257/76 |
| 2012/0003770 A1* | 1/2012 | Hashimoto et al. | 438/46 |
| 2012/0119219 A1* | 5/2012 | Takado et al. | 257/76 |

FOREIGN PATENT DOCUMENTS

| | | | |
|---|---|---|---|
| CN | 102326231 A | | 1/2012 |
| JP | 11-135885 | | 5/1999 |
| JP | 11-186602 | | 7/1999 |
| JP | 2003-234501 | | 8/2003 |
| JP | 2004-115371 | | 4/2004 |
| JP | 2004-296717 | | 10/2004 |
| JP | 2005-347494 | | 12/2005 |
| JP | 2006-128626 | | 5/2006 |
| JP | 2010-53002 | | 3/2010 |
| JP | 2010-232364 | | 10/2010 |
| JP | 5319810 | | 10/2013 |
| KR | 10-1105868 | * | 1/2012 |
| TW | 473798 | | 11/2002 |

OTHER PUBLICATIONS

Decision of Refusal issued Jan. 11, 2013 in Japanese patent Application No. 2012-052343 (with English translaiton).

U.S. Appl. No. 13/407,169, filed Feb. 28, 2012, Tomonari Shioda, et al.

U.S. Appl. No. 13/222,561, filed Aug. 31, 2011, Tomonari Shioda, et al.

Office Action issued Aug. 17, 2012 in Japanese Application No. 2012-052343 (With English Translation).

Office Action issued Nov. 4, 2013 in Korean Application No. 10-2012-148214 (With English Translation).

U.S. Appl. No. 13/868,275, filed Apr. 23, 2013, Harada, et al.

Chinese Office Action issued on Apr. 24, 2015 in Chinese Application No. 201210560783.X with English translation (25 pages).

Combined Chinese Office Action and Search Report issued Nov. 6, 2015 in Patent Application No. 201210560783.X (with English language translation).

Japanese Office Action issued on Nov. 2, 2015 in Japanese Application No. 2013-081635, with English translation (11 pages).

Akinori Ubukata, et al., "Development of Production-Scale MOCVD System for GaN Power Deviced N Si Substrates", Technical Report of Taiyou Nissa, Japan No. 30, pp. 23-28.

* cited by examiner

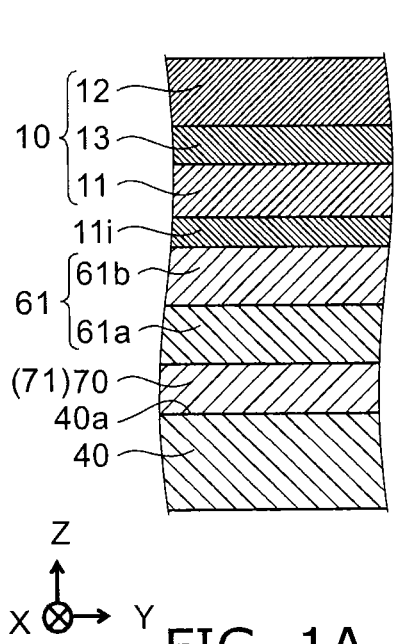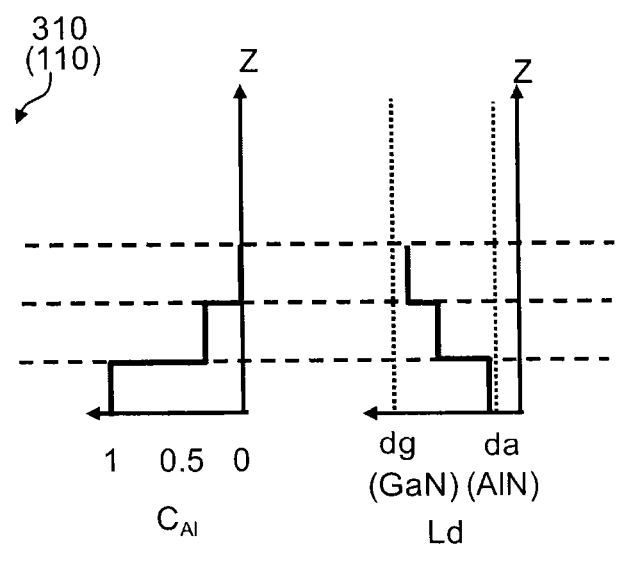
FIG. 1A  FIG. 1B  FIG. 1C

METHOD FOR MANUFACTURING NITRIDE SEMICONDUCTOR LAYER

CROSS-REFERENCE TO RELATED APPLICATIONS

This application is based upon and claims the benefit of priority from the prior Japanese Patent Application No. 2012-052343, filed on Mar. 8, 2012; the entire contents of which are incorporated herein by reference.

FIELD

Embodiments described herein relate generally to a method for manufacturing a nitride semiconductor layer.

BACKGROUND

A light emitting diode (LED), which is a semiconductor light emitting device by use of a nitride semiconductor, is used in, for example, a display device and lighting. Further, an electronic device by use of a nitride semiconductor is utilized in a high-speed electronic device and a power device.

If such nitride semiconductor devices are provided on a silicon (Si) substrate excellent in mass-productivity, cracks are liable to occur owing to a difference in lattice constant and thermal expansion coefficient. There is a desire for technologies which make high quality crystals on the silicon substrate.

BRIEF DESCRIPTION OF THE DRAWINGS

FIG. 1A to FIG. 1C are schematic diagrams showing a nitride semiconductor layer according to first embodiment;

DETAILED DESCRIPTION

Figure 2:
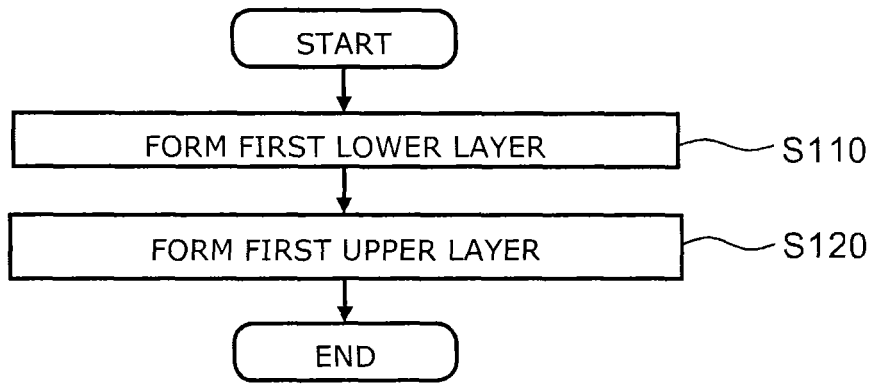
FIG. 2 is a flowchart showing a method for manufacturing the nitride semiconductor layer according to the first embodiment.

According to one embodiment, a method for manufacturing a nitride semiconductor layer is disclosed. The method can include forming a first lower layer of a nitride semiconductor on a major surface of a substrate and forming a first upper layer of a nitride semiconductor on the first lower layer to form a first stacked body including the first lower layer and the first upper layer. The first lower layer has a first lattice spacing along a first axis parallel to the major surface. The first upper layer has a second lattice spacing along the first axis larger than the first lattice spacing. At least a part of the first upper layer has a first compressive strain. An absolute value of a ratio of a difference between the second lattice spacing and the first lattice spacing to the first lattice spacing is not less than 0.005 and not more than 0.019. The forming the first upper layer includes making a growth rate of the first upper layer in a direction parallel to the major surface larger than a growth rate of the first upper layer in a direction perpendicular to the major surface, and forming the first upper layer while applying the first compressive strain on the first upper layer. The first compressive strain is based on the difference between the second lattice spacing and the first lattice spacing.

Various embodiments will be described hereinafter with reference to the accompanying drawings.

The drawings are schematic or conceptual and, therefore, are not always realistic in denotation of the relationship between thickness and width of each of components, the size ratio between the components, etc. Further, even the same component may be shown in different sizes and ratios in the different drawings.

In the specification and the drawings, identical reference numerals are given to the identical components, and detailed description on the identical components will be omitted.

(First Embodiment)

The embodiment relates to a method for manufacturing a nitride semiconductor layer. The nitride semiconductor layer according to the embodiment is used in a semiconductor light emitting device, a semiconductor light receiving device, or a semiconductor device such as an electronic device. The semiconductor light emitting devices include, for example, a light emitting diode (LED) and a laser diode (LD). The semiconductor light receiving devices include a photo-diode (PD). The electronic devices include, for example, high electron mobility transistor (HEMT), a hetero-junction bipolar transistor (HBT), a field effect transistor (FET), and a Schottky barrier diode (SBD).

First, a description will be given of an example of a configuration of the nitride semiconductor layer according to the embodiment.

FIG. 1A to FIG. 1C are schematic diagrams illustrating a nitride semiconductor layer according to first embodiment.

FIG. 1A is a schematic cross-sectional view illustrating a configuration of the nitride semiconductor layer according to the embodiment. FIG. 1B is a graph illustrating a composition ratio of Al in the nitride semiconductor layer. FIG. 1C is a graph illustrating a lattice spacing Ld of an a-axis in the nitride semiconductor layer.

As shown in FIG. 1A, a nitride semiconductor layer 310 according to the embodiment includes a first stacked body 61 provided on a major surface 40a of a substrate 40. The first stacked body 61 includes a first lower layer 61a provided on the major surface 40a and a first upper layer 61b provided on the first lower layer 61a. The first lower layer 61a and the first upper layer 61b are made of a nitride semiconductor.

In this example, a buffer layer 70 is provided on the major surface of the substrate 40, and the first stacked body 61 is provided on the buffer layer 70.

A direction perpendicular to the major surface 40a is assumed to be a Z axis. The Z axis is parallel to a direction from the first lower layer 61a to the first upper layer 61b. One axis perpendicular to the Z axis is assumed to be an X axis. A direction perpendicular to the Z axis and the X axis is assumed to a Y axis. A functional layer 10 is stacked along the Z axis along with the first stacked body 61.

In the specification, the expression of "provided on" includes a case where something is provided directly on anything else as well as a case where something is provided via anything else inserted. Further, the expression of "stacked" includes a case where something is stacked directly on anything else as well as something is stacked via anything else inserted.

The substrate 40 is made of, for example, silicon. The silicon substrate is, for example, a Si(111) substrate. However, in the embodiment, the plane direction of the silicon substrate may not be (111). As the substrate 40, a silicon to substrate can be used which has the plane direction of (11n) (n: integer) or (100). Use of a (110) plane-direction silicon substrate is favorable because lattice mismatch between the silicon substrate and the nitride semiconductor layer is reduced.

The substrate 40 may include an oxide layer. For example, as the substrate 40, a silicon-on-insulator (SOI) substrate can be used. As the substrate 40, a substrate can be used which is made of a material having a lattice constant different from that of the functional layer 10. As the substrate 40, a substrate can be used which contains a material having a thermal expansion coefficient different from that of the functional layer 10. For example, the substrate 40 may be made of sapphire, spinel, GaAs, InP, ZnO, Ge, SiGe or SiC.

A nitride semiconductor device using the nitride semiconductor layer according to the embodiment may be used in a state where some of the substrate 40, the buffer layer 70, the first stacked body 61, and the functional layer 10 are removed.

As the buffer layer 70, an AlN layer 71 is used, for example. The AlN layer 71 preferably has a thickness of, for example, at least 20 nanometers (nm) and not more than 400 nm, for example, about 100 nm. By using AlN, which is not liable to react chemically with silicon in the substrate 40, at a portion of the buffer layer 70 that comes in contact with the substrate 40, it becomes easy to solve a trouble such as melt-back etching occurring due to reaction between silicon and gallium.

For example, in the case of using the AlN layer 71, the growth temperature for the buffer layer 70 is preferably not less than 500 and not more than 1300 degrees Celsius. More preferably, it is not less than 600 and not more than 1200 degrees Celsius.

As shown in FIG. 1B, as the material of the first lower layer 61a of the first stacked body 61, $Al_{x1}Ga_{1-x1}N$ (0<x1<1) is used, for example. Hereinafter, for ease of description, the expression of "AlGaN" is used for $Al_{x1}Ga_{1-x1}N$ (0<x1<1) appropriately in some cases.

As the material of the first upper layer 61b of the first stacked body 61, GaN is used, for example. The composition ratio of Al in the first upper layer 61b is lower than that of Al in the first lower layer 61a. The first upper layer 61b does not include, for example, Al substantially.

The thickness of the first lower layer 61a is preferably, for example, not less than 100 nm and not more than 500 nm, for example, about 250 nm. The composition ratio (x1) of Al in the first lower layer 61a is preferably, for example, not less than 0.1 and not more than 0.9. More preferably, it is not less than 0.2 and not more than 0.6, for example, 0.25. The composition ratio of Al is a ratio of the number of the Al element atoms to the number of the group-III element atoms. The first lower layer 61a can increase the effects of inhibiting melt-back etching.

The lattice spacing along a first axis (for example, an a-axis) in an X-Y plane of the first lower layer 61a (AlGaN layer) is the same as that along the first axis of the AlN layer 71 or larger than that along the first axis of the AlN layer 71. The lattice spacing along the first axis (for example, the a-axis) of the first lower layer 61a (AlGaN) is smaller than the unstrained lattice spacing (lattice constant) of the first lower layer 61a (AlGaN layer). This causes the compressive strain (stress) to be formed in the first lower layer 61a (AlGaN layer). This can reduce tensile stress which occurs due to a difference in thermal expansion coefficient between the nitride semiconductor layer and the substrate 40 (silicon substrate) during a cooling process after the crystal growth in the nitride semiconductor layer to inhibit the occurrence of cracks.

In a case where a plurality of the nitride semiconductor layers having mutually different compositions are stacked, the upper stacked nitride semiconductor layer (for example, the first upper layer 61b) is formed to match the lattice spacing of the nitride semiconductor layer (for example, the first lower layer 61a) formed under it. Therefore, the actual lattice length of the nitride semiconductor layer is different from the unstrained lattice spacing (lattice constant).

In the specification, the unstrained lattice length of the nitride semiconductor is taken as the "lattice constant". An actual lattice length of the formed nitride semiconductor layer is taken as the "lattice spacing". The lattice constant is, for example, a physical constant. The lattice spacing refers to, for example, the actual lattice length of the nitride semiconductor layer included in a formed nitride semiconductor device. The lattice spacing is obtained by, for example, X-ray diffraction measurement.

As shown in FIG. 1C, the lattice spacing Ld (first lattice spacing) in the first lower layer 61a (AlGaN layer) has a value, for example, between a unstrained GaN lattice length (lattice constant) dg and a unstrained AlN lattice length (lattice constant) da.

The thickness of the first upper layer 61b is preferably, for example, not less than 200 nm and not more than 2000 nm, for example, 1000 nm. The lattice spacing Ld (second lattice spacing) of the first upper layer 61b is the same as the first lattice spacing or larger than the first lattice spacing.

At least a portion of the first upper layer 61b has compressive strain (a first compressive strain). For example, at least the lower side portion of the first upper layer 61b (portion on the side of the first lower layer 61a) has compressive strain. As described later, if the thickness of the first upper layer 61b is large, the upper side portion of the first upper layer 61b may not have compressive strain in some cases.

Compressive strain (stress) occurs easily during the crystal growth of the first stacked body 61 by forming the first upper layer 61b having a larger lattice constant (second lattice constant) than the first lattice spacing of the first lower layer 61a on the first lower layer 61a so as to match the lattice spacing of the first lower layer 61a as much as possible. This can inhibit cracks generation.

However, during the crystal growth of the first upper layer 61b, as the thickness of the first upper layer 61b increases, lattice relaxation occurs so that the lattice spacing of the first upper layer 61b comes close to the lattice constant of the unstrained first upper layer 61b. That is, the lattice spacing (second lattice spacing) of the first upper layer 61b becomes larger than the lattice spacing of the first lower layer 61a. In a case where the lattice spacing (second lattice spacing) of the first upper layer 61b has become substantially equal to the lattice constant of the first upper layer 61b, even if the thickness is increased more, no compressive stress occurs in the first upper layer 61b, so that it becomes to be easily influenced by tensile strain (stress) from the substrate 40 (silicon substrate). Therefore, the thickness of the first upper layer 61b is preferably be not more than a value at which the lattice spacing (second lattice spacing) of the first upper layer 61b along the first axis (for example, a-axis) in the X-Y plane can be kept smaller than the lattice constant of the first upper layer 61b.

As shown in FIG. 1A, in a case where a nitride semiconductor layer 310 is a light emitting device, the functional layer 10 includes, for example, a first semiconductor layer 11 of a first conductivity type (for example n-type), a second semiconductor layer 12 of a second conductivity type (for example p-type), and a light emitting layer 13 provided between the first semiconductor layer 11 and the second semiconductor layer 12. The light emitting layer 13 includes a plurality of GaN barrier layers and an InGaN (for example, $In_{0.15}Ga_{0.85}N$) well layer provided between the barrier layers. The light emitting layer 13 has a multi-quantum well (MQW) structure or a single-quantum well (SQW) structure. The thickness of the functional layer 10 is preferably, for example, not less than 1 micrometer (μm) and not more than 5 micrometers, for example, about 3.5 micrometers. Thus, the functional layer 10 may include an n-type semiconductor layer.

Further, the nitride semiconductor layer 310 can be used for a nitride semiconductor device, for example, a gallium nitride (GaN) based high electron mobility transistor (HEMT). In this case, the functional layer 10 has a stacked structure including an undoped $Al_{z1}Ga_{1-z1}N$ layer ($0 \leq Z1 < 1$) containing no impurity and an undoped or n-type $Al_{z2}Ga_{1-z2}N$ layer ($0 \leq z2 \leq 1$, $z1 < z2$). In this case, the thickness of the functional layer 10 is preferably about not less than 10 nm and not more than 1000 nm, for example, 50 nm.

Further, on the first stacked body 61 (for example, between the first stacked body 61 and the functional layer 10), a GaN layer 11i (for example, undoped GaN layer) may be provided further. The GaN layer 11i may be a doped semiconductor layer such as an n-type semiconductor layer. By providing the GaN layer 11i (undoped GaN layer), compressive strain (stress) occurs in the GaN layer 11i to inhibit the occurrence of cracks more.

FIG. 2 is a flowchart illustrating a method for manufacturing a nitride semiconductor layer according to the first embodiment.

The method for manufacturing a nitride semiconductor layer according to the embodiment includes a process of forming the first stacked body 61.

As shown in FIG. 2, the process of forming the first stacked body 61 includes processing (step S110) of forming the first lower layer 61a made of a nitride semiconductor having a first lattice spacing along the first axis parallel to the major surface 40a of the substrate 40 on the major surface 40a and processing (step S120) of forming the first upper layer 61b made of a nitride semiconductor having a second lattice spacing along the first axis larger than the first lattice spacing and at least partially having compressive strain on the first lower layer 61a. This forms the first stacked body 61 including the first lower layer 61a and the first upper layer 61b.

At this time, the ratio of a difference between the second lattice spacing and the first lattice spacing to the first lattice spacing is taken to be a lattice mismatch factor LM (first lattice mismatch factor LM1) in the first stacked body 61. In the embodiment, the absolute value of the lattice mismatch factor LM is taken to be not less than 0.005 and not more than 0.019.

Then, in the formation of the first upper layer 61b (step S120), the growth rate (horizontal growth rate) of the first upper layer 61b in a direction parallel to the major surface 40a is made larger than that (vertical growth rate) of the first upper layer 61b in a direction perpendicular to the major surface 40a. In the formation of the first upper layer 61b (step S120), the first upper layer 61b is formed while compressive stress based on the difference between the second lattice spacing and the first lattice spacing is being applied to the first upper layer 61b.

This allows a high-quality nitride semiconductor layer in which the occurrence of cracks is inhibited to be manufactured. This configuration is based on a phenomenon found by the inventors of the application through the original experiment. The experiment will be described in the following.

In the experiment, a nitride semiconductor layer is used in a nitride semiconductor device 110. The nitride semiconductor device 110 has a configuration described with reference to FIG. 1A to FIG. 1C. The method for manufacturing the nitride semiconductor layer used in the nitride semiconductor device 110 will be specifically described in the following.

The silicon substrate 40 is processed with organic washing and acid washing and then introduced into the reaction chamber of an MOCVD apparatus. The substrate 40 is heated to a temperature of 1080° C. and thereafter the AlN layer 71 is formed by using tri-methyl aluminum (TMAl) and ammonia ($NH_3$) at a growth pressure of 400 hPa in an atmosphere containing nitrogen and hydrogen. $NH_3$ is supplied at a rate of 1 L/min and TMAl is supplied at a rate of 25 cc/min. The AlN layer 71 has a thickness of about 100 nm.

The temperature of the substrate 40 is set to 1050° C. to form an AlGaN layer as the first lower layer 61a by using tri-methyl aluminum (TMGa), TMAl, and ammonia at a growth pressure of 400 hPa in an atmosphere containing nitrogen and hydrogen. In the experiment, the composition ratio of Al in the AlGaN layer is changed. For example, in a case where the composition ratio of Al is 0.25, TMAl is supplied at a rate of 25 cc/min and TMGa is supplied at a rate of 18 cc/min. The composition ratio of Al is changed by changing the ratios of TMA and TMGa in a condition where a total supply amount of TMAl and TMGa is set to a constant value. $NH_3$ is supplied at a rate of 2.5 L/min. The AlGaN layer has a thickness of about 250 nm.

The temperature of the substrate 40 is set to 1090° C. to form a GaN layer as the first upper layer 61b by using TMGa and ammonia at a growth pressure of 1013 hPa in an atmosphere containing nitrogen and hydrogen. $NH_3$ is supplied at a rate of 20 L/min and TMGa is supplied at a rate of 47 cc/min. The ratio of ammonia as the group-V source gas to TMGa as the group-III source gas, that is, a V/III ratio is 3900. The V/III ratio refers to a ratio of the number of atoms of the group-V element supplied for each unit time to the number of atoms of the group-III element supplied for each unit time. The GaN layer has a thickness of about 550 nm.

In the experiment, by changing the composition ratio of Al in the AlGaN layer serving as the first lower layer 61a, the lattice mismatch factor between the first lower layer 61a and the first upper layer 61b is changed. Moreover, specimens are fabricated which have different V/III ratios in formation of the GaN layer serving as the first upper layer 61b. That is, when the GaN layer serving as the first upper layer 61b is being grown, a flow rate of the TMGa as the group-III source gas is fixed to 18 cc/min and flow rates of ammonia are set to 5 L/min, 10 L/min, 20 L/min, and 40 L/min, respectively, thereby forming the GaN layer serving as the first upper layer 61b. At this time, the ratios between ammonia and TMGa, that is the V/III ratios are 980, 1950, 3900, and 7800, respectively.

Then, the lattice mismatch factor LM of those specimens and the curvature (warpage) of the substrates (specimens) are evaluated. The lattice mismatch factor LM in the AlGaN layer and the GaN layer is calculated using reciprocal lattice mapping measurement based on X-ray diffraction. The value of curvature of the substrates (specimens) is measured with an optical monitor during film formation.

Figure 3:
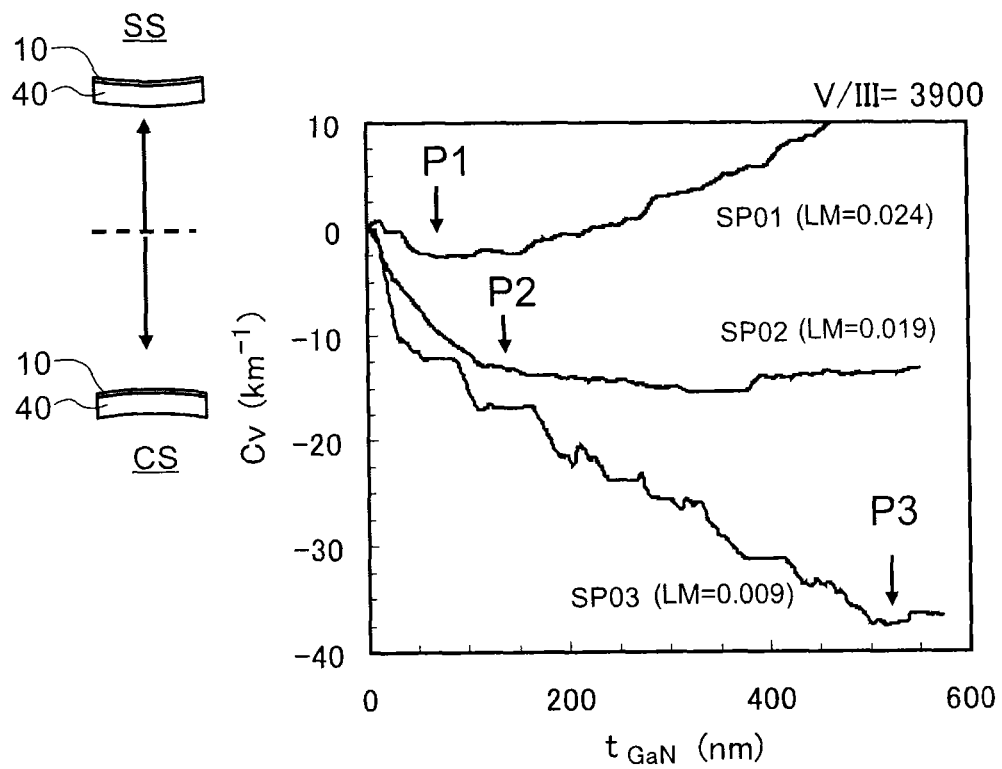
FIG. 3 is a graph showing characteristics of the nitride semiconductor layer.

FIG. 3 is a graph illustrating characteristics of the nitride semiconductor layer.

FIG. 3 shows an example of results of the experiment. FIG. 3 shows an example of changes in curvature (warpage) of the substrates when the first upper layer 61b (GaN layer) is being formed on the first lower layer 61a (AlGaN layer). In this example, results are shown of three specimens (first specimen SP01 to third specimen SP03) whose composition ratios of Al in the first lower layer 61a (AlGaN layer) are changed in a condition where the V/III ratio is kept to a constant value of 3900.

For the first specimen SP01, the lattice mismatch factor LM is 0.024. For the second specimen SP02, the lattice mismatch factor LM is 0.019. For the third specimen SP03, the lattice mismatch factor LM is 0.009.

The horizontal axis of FIG. 3 gives a thickness $t_{GaN}$ (nm) of the first upper layer 61b. The thickness $t_{GaN}$ (nm) corresponds to the elapsing of crystal growing time of the first upper layer 61b (GaN layer). The vertical axis gives a curvature Cv (km$^{-1}$) of the substrates and substantially corresponds to the warpage of the substrates. The curvature Cv is given as a value measured with an optical monitoring system when the crystal of the first upper layer 61b (GaN layer) is growing. The curvature Cv is given as a value which is standardized on the assumption that the curvature (warpage) of the substrate 40 at the time of start of the GaN layer growing is 0. If the curvature Cv is positive in value, the substrate 40 is convex shaped downward (of concave-shaped warpage). If it is negative in value, the substrate 40 is convex upward (of convex-shaped warpage). The curvature Cv, if positive, corresponds to the warpage of the substrate 40 caused by tensile stress applied to the nitride semiconductor layer. The curvature Cv, if negative, corresponds to the warpage of the substrate 40 caused by compressive stress applied to the nitride semiconductor layer.

As shown in FIG. 3, for the first specimen SP01 (whose lattice mismatch factor LM is 0.024), if the thickness $t_{GaN}$ increases from 0 nm to 50 nm (point P1), the curvature Cv is negative and its absolute value increases. In a range where the thickness $t_{GaN}$ is 50 nm to 150 nm, the rate of change of the curvature Cv decreases, so that the curve of the curvature Cv becomes almost horizontal. Then, if the thickness $t_{GaN}$ exceeds 150 nm, the curvature Cv turns positive and its absolute value increases, so that it has a downward convex-shaped warpage. That is, as the GaN layer grows, tensile stress builds in it.

For the second specimen SP02 (whose lattice mismatch factor LM is 0.019), in a range where the thickness $t_{GaN}$ is 0 nm to 100 nm (point P2), as the $t_{GaN}$ increases, the curvature Cv is negative and its absolute value increases. In a range where the $t_{GaN}$ is 100 nm to 400 nm, the rate of change of the curvature Cv is small, so that the curve of the curvature Cv is almost horizontal. Then, if the $t_{GaN}$ exceeds 400 nm, the curvature Cv rises in a positive direction.

For the third specimen SP03 (whose lattice mismatch factor is 0.009), in a range where the $t_{GaN}$ is 0 nm to 500 nm (point P3), as the $t_{GaN}$ increases, the curvature Cv is negative and its absolute value increases. The change rate (reduction rate) of the curvature Cv is larger than that of the second specimen SP02. If the thickness $t_{GaN}$ exceeds 500 nm, the rate of change of the curvature Cv is small, so that the curve of the curvature Cv becomes almost horizontal.

In such a manner, the different specimens have the different characteristics about changes in curvature Cv. The thicknesses $t_{GaN}$ (points P1, P2, and P3) at which the curve of the curvature Cv becomes horizontal refer to thicknesses at which compressive stress stops being applied to the GaN layers in the specimens respectively. In such a manner, the thickness at which compressive stress stops being applied to the GaN layer is taken to be a "maximum thickness at the time of compressive stress application" tc (nm). The maximum thicknesses at the time of compressive stress application tc are 50 nm, 100 nm, and 500 nm for the first specimen SP01, the second specimen SP02, and the third specimen SP03, respectively.

In such a manner, the maximum thicknesses at the time of compressive stress application tc for the respective specimens are obtained.

Figure 4:
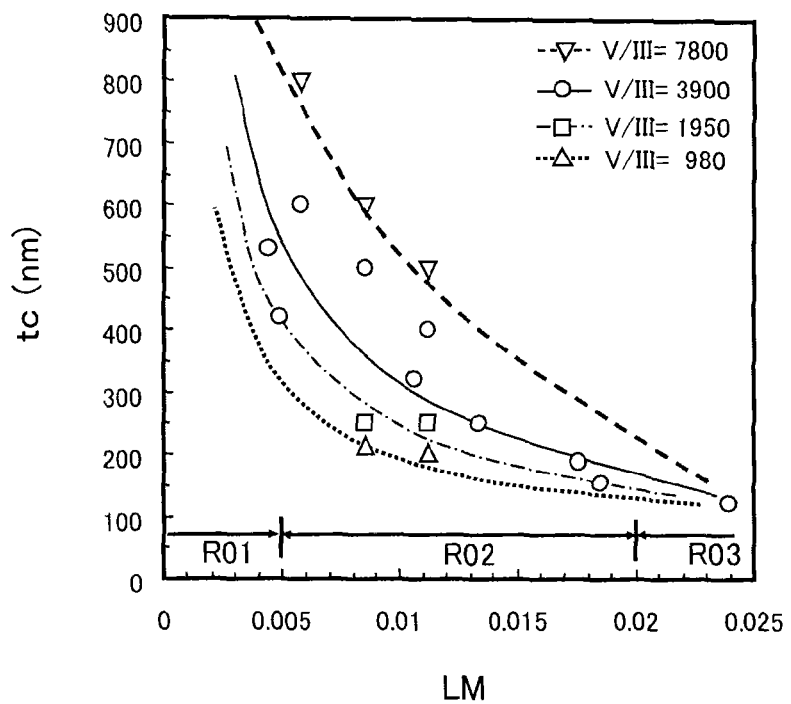
FIG. 4 is a graph showing characteristics of the nitride semiconductor layer.

FIG. 4 is a graph illustrating characteristics of the nitride semiconductor layer.

FIG. 4 illustrates a relationship between the maximum thickness at the time of compressive stress application tc for each of the manufactured specimens and the lattice mismatch factor LM between the AlGaN layer and the GaN layer.

In FIG. 4, the horizontal axis gives the lattice mismatch factor LM and the vertical axis gives the maximum thickness at the time of compressive stress application tc. FIG. 4 shows results obtained when the composition ratio of Al in the AlGaN layer serving as the first lower layer 61a is changed and the V/III ratio at the time of forming the GaN layer serving as the first upper layer 61b is changed to 980, 1950, 3900, and 7800. By changing the composition ratio of Al in the AlGaN layer, the lattice mismatch factor LM takes on a different value. However, the value of the lattice mismatch factor LM relates to the lattice spacing in an actually formed layer. That is, if the Al composition ratio is 0.25, the lattice mismatch factor LM is about 0.006 in a case where the AlGaN layer and the GaN layer have unstrained lattice spacings (lattice constants), whereas the lattice mismatch factor LM for an actually manufactured specimen is about 0.009. This is because, as described above, in a case where a plurality of nitride semiconductor layers having mutually different compositions are stacked, the upper-stacked nitride semiconductor layer is formed so that it may match the lattice length of the lower-stacked nitride semiconductor layer. The lattice mismatch factor LM depends not only on the Al composition ratio in the AlGaN layer but also on the film formation conditions. The conditions for the lattice mismatch factor LM being 0.024 correspond to a case where an AlN layer is used as the first lower layer 61a, that is, the Al composition ratio in the first lower layer 61a is 1.

As can be seen from FIG. 4, as the lattice mismatch factor LM increases, the maximum thickness at the time of compressive stress application tc decreases. This may be considered because as the lattice mismatch factor LM increases, lattice relaxation is apt to occur in the GaN layer and, even if the GaN layer is thin, occurs easily. Conversely, as the lattice mismatch factor LM decreases, the maximum thickness at the time of compressive stress application tc increases. This is considered because if the lattice mismatch factor LM is small, lattice relaxation of GaN hardly occurs and, even if the GaN layer is thick, does not occur.

In such a manner, it is natural that the maximum thickness at the time of compressive stress application tc tends to be inversely proportional to the lattice mismatch factor LM. That is, it is a natural tendency that a product of the maximum thickness at the time of compressive stress application tc and the lattice mismatch factor LM is substantially constant.

In this case, it is found that, as can be seen from FIG. 4, the relationship between the maximum thickness at the time of compressive stress application tc and the lattice mismatch factor LM changes with the GaN layer crystal growth conditions (V/III ratio in this example).

For example, if the Al composition ratio in the first lower layer 61a (AlGaN layer) is 0.25, the lattice mismatch factor LM corresponds to 0.009. If the lattice mismatch factor LM is about 0.009, the maximum thickness at the time of compressive stress application tc is about 200 nm when the V/III ratio is 980, about 250 nm when the V/III ratio is 1950, about 350 nm to about 500 nm when the V/III ratio is 3900, and about 600 nm when the V/III ratio is 7800.

In such a manner, it is a characteristic found first in the experiment that the relationship between the maximum thickness at the time of compressive stress application tc and the lattice mismatch factor LM changes with the growth conditions of GaN layer. By appropriately controlling the growth conditions of GaN layer, the maximum thickness at the time of compressive stress application tc can be increased even if the lattice mismatch factor LM is kept constant. Further, by increasing the maximum thickness at the time of compressive stress application tc, it is possible to form a GaN layer having a necessary thickness in a condition where compressive stress is applied on it. The compressive stress applied on the GaN layer serves to weaken tensile stress occurring due to the thermal expansion coefficient mismatch between the silicon substrate and the GaN layer, thereby inhibiting crack occurrence. For example, by making the compressive stress in the GaN layer larger than the tensile stress occurring due to the thermal expansion coefficient mismatch between the silicon substrate and the GaN layer, cracks can be effectively inhibited from occurring.

For example, when the Al composition ratio in the first lower layer 61a (AlGaN layer) is 0.25 (the lattice mismatch factor LM is 0.009), cracks occurred in the surfaces of the specimen having the V/III ratio of 980 and the specimen having the V/III ratio of 1950. As for those specimens, the thickness (about 550 nm) of the first upper layer 61b (GaN layer) significantly exceeds the maximum thicknesses at the time of compressive stress application tc (about 200 nm and about 250 nm) of the specimen having the V/III ratio of 980 and the specimen having the V/III ratio of 1950. It is considered that as a result, sufficient compressive stress could not be formed in the GaN layer to apply tensile stress on the GaN layer owing to the difference in thermal expansion coefficient between the silicon substrate and the GaN layer, thereby giving rise to cracks.

On the other hand, when the Al composition ratio in the first lower layer 61a (AlGaN layer) is 0.25 (the lattice mismatch factor LM is 0.009), no cracks occurred in the specimen having the V/III ratio of 3900 and the specimen having the V/III ratio of 7800. As for those specimens, the thickness (about 550 nm) of the first upper layer 61b (GaN layer) is not greatly in excess of the maximum thicknesses at the time of compressive stress application tc (about 350 nm to about 500 nm, about 600 nm) of those specimens. Consequently, it is considered that no cracks occurred because no tensile stress is substantially applied to the GaN layer.

Further, for example, when the Al composition ratio in the first lower layer 61a (AlGaN layer) is 0.5, the lattice mismatch factor LM corresponds to about 0.011. The corresponding maximum thickness at the time of compressive stress application tc is about 200 nm when the V/III ratio is 980, about 280 nm when the V/III ratio is 1950, about 300 nm to about 400 nm when the V/III ratio is 3900, and about 500 nm when the V/III ratio is 7800. When cracks in those specimens are evaluated, some cracks occurred in the specimen having the V/III ratio of 980 and no cracks occurred in the other specimens. It is also found that if the V/III ratio is a large value of 9700, no cracks occurred but some defects occurred in the silicon substrate, to deteriorate the crystal quality of the GaN layer. This is considered because too large compressive stress occurred in the GaN layer, the silicon substrate is damaged.

That is, if the GaN layer has too small compressive stress, tensile stress is applied to the GaN layer after the growth of nitride layer, to give rise to cracks. If the GaN layer has too large compressive stress, tensile stress is applied to the silicon substrate after the growth of nitride layer, to damage the silicon substrate.

As described above, concerning the conditions for the crystal growth of the GaN layer, the larger the ammonia flow rate, that is, the V/III ratio is, the thicker the GaN layer in which compressive stress can occur becomes. By increasing the V/III ratio, cracks are more effectively inhibited from occurring.

As shown in FIG. 4, according to the conditions for the crystal growth of the GaN layer, the degree that the relationship between the maximum thickness at the time of compressive stress application tc and the lattice mismatch factor LM is reduced if the lattice mismatch factor LM is excessively large. For example, the difference in maximum thickness at the time of compressive stress application tc owing to a difference in V/III ratio is remarkable in a range R02 of the lattice mismatch factor LM of not less than 0.005 and not more than 0.02. Even in the range R02, if the lattice mismatch factor LM is increased, the difference in maximum thickness at the time of compressive stress application tc owing to the difference in V/III ratio is reduced. Then, the curve of the relationship between the maximum thickness at the time of compressive stress application tc and the lattice mismatch factor LM tends to converge on a point (in a case where the first lower layer 61a is made of AlN layer) at which the lattice mismatch factor LM is 0.024. For example, in a range R03 in which the lattice mismatch factor LM is in excess of 0.02, it is considered that the relationship between the maximum thickness at the time of compressive stress application tc and the lattice mismatch factor LM does not change substantially according to the conditions for the growth of the GaN layer crystal.

In the embodiment, in order to create necessary compressive stress, by forming the AlGaN layer (AlGaN layer for forming a necessary lattice mismatch factor LM) having a necessary Al composition ratio and then growing the crystal of a GaN later to be formed on this AlGaN layer under appropriate conditions, the maximum thickness at the time of compressive stress application tc is increased to inhibit the occurrence of cracks. Therefore, a lattice mismatch factor LM is employed which is in the range R02 in which the relationship between the maximum thickness at the time of compressive stress application tc and the lattice mismatch factor LM changes to according to the conditions for the growth of the GaN layer. If a lattice mismatch factor LM in the range R03 is employed, the relationship between the maximum thickness at the time of compressive stress application tc and the lattice mismatch factor LM does not change substantially according to the conditions for the growth of the GaN layer crystal, so that the effects of increasing the maximum thickness at the time of compressive stress application tc cannot be obtained even under the appropriate crystal growth conditions, so that cracks cannot sufficiently be inhibited from occurring.

Figure 5:
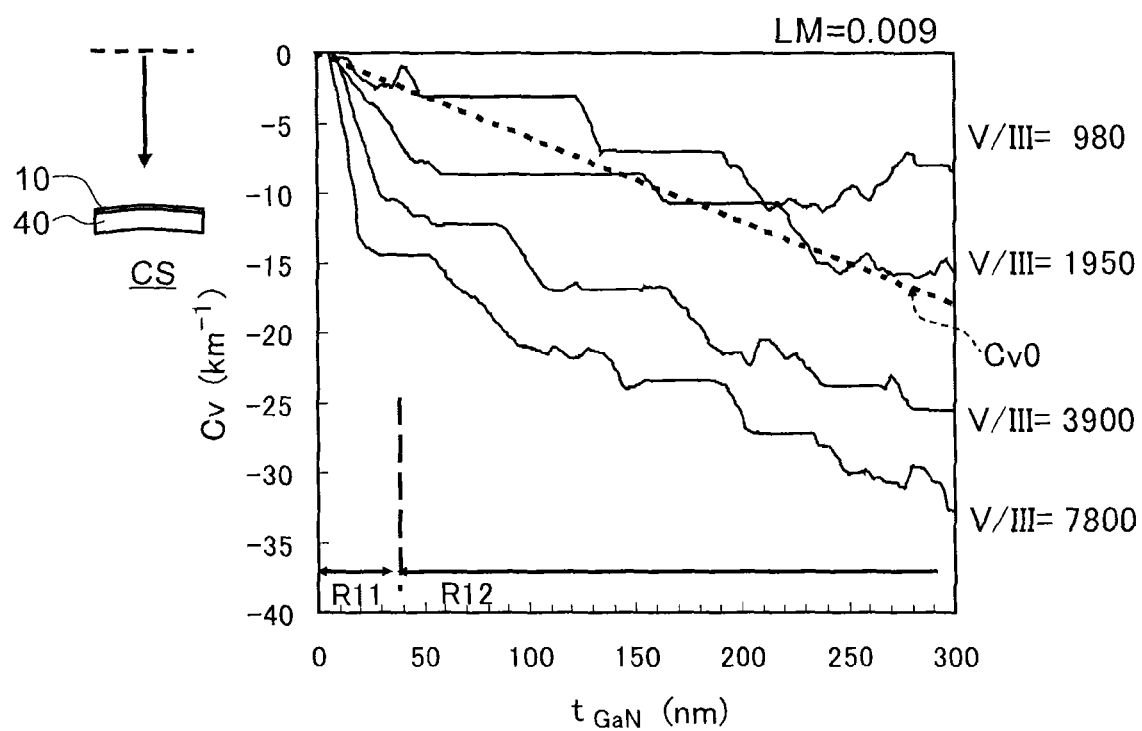
FIG. 5 is a graph showing characteristics of the nitride semiconductor layer.

FIG. 5 is a graph illustrating characteristics of the nitride semiconductor layer.

FIG. 5 shows the curvature Cv (warpage) of the substrate 40 in the specimens whose V/III ratio is 980, 1950, 3900, and 7800 in a condition where the lattice mismatch factor LM is 0.009 (the Al composition ratio is 0.25 in the AlGaN layer) and the GaN layer is growing. The horizontal axis of FIG. 5 gives a thickness $t_{GaN}$ of the first upper layer 61b (GaN layer). The vertical axis gives the curvature Cv of the substrate. FIG. 5 shows the transition of warpage of the substrate 40 when the first upper layer 61b (GaN layer) is growing. The curvature Cv is standardized on the assumption that the curvature (warpage) of the substrate 40 at the time of start of the crystal growth of GaN layer is 0.

As shown in FIG. 5, if the V/III ratio increases, the curvature Cv (warpage) of the substrate 40 during formation of the GaN layer increases. It is found that at this time the behavior changes between a range R11 in which the thickness $t_{GaN}$ is less than about 40 nm and a range R12 in which the thickness $t_{GaN}$ is not less than about 40 nm. For example, if the V/III ratio is 7800, the curvature Cv takes on a steep gradient in the range R11 in which the thickness $t_{GaN}$ is less than about 40 nm. In the range R12 in which the thickness $t_{GaN}$ is not less than about 40 nm, the curvature Cv takes on a moderate gradient. The other V/III ratios have similar tendencies.

That is, if the GaN layer is thin (for example, less than about 40 nm) at the initial growth stage of the GaN layer, the absolute value of the curvature Cv increases rapidly as the thickness increases. Then, if the thickness takes on at least a certain value (for example, not less than 40 nm), the curvature Cv changes moderately.

It is considered that for example, the AlGaN-made foundation layer has a somewhat large influence at the initial growth stage of the GaN layer but is less influential if the AlGaN layer has a certain thickness. That is, it is considered that a phenomenon (first phenomenon) that occurs at the initial growth stage of the GaN layer is different from a phenomenon (second phenomenon) that occurs after the first phenomenon.

It is considered that in the range R03 (in which the lattice mismatch factor LM is in excess of 0.02) shown in FIG. 4, the maximum thickness at the time of compressive stress application tc is small, and thus the first phenomenon occurring at the initial growth stage of the GaN layer is dominant. It is considered that in the range R02 (in which the lattice mismatch factor LM is not more than 0.02), the following second phenomenon is dominant. In the embodiment, the range R02 in which the second phenomenon occurs is applied to effectively inhibit the occurrence of cracks.

In FIG. 4, if the lattice mismatch factor LM is excessively small (for example, in the range R01 in which it is less than 0.005), the GaN layer needs to be thick excessively to accumulate compressive stress necessary to inhibit the occurrence of cracks. The excessive thickness affects, for example, crystallinity. Consequently, in the embodiment, the lattice mismatch factor LM is set to at least 0.005 as conditions that enable accumulating the necessary compressive stress even without increasing the thickness of the GaN layer excessively. That is, in method for manufacturing the nitride semiconductor layer according to the embodiment, a lattice mismatch factor LM is employed which is not less than 0.005 and not more than 0.020. More preferably, the lattice mismatch factor LM is be not more than 0.015.

Moreover, FIG. 5 shows warpage (cancel curvature Cv0) of the substrate during the growth of crystal that is necessary to cancel the warpage of the substrate which occurs when the temperature is falling after the crystal growth.

As shown in FIG. 5, a curvature Cv having the V/III ratio of 980 is above a dotted line of the cancel curvature Cv0. The curvature Cv having the V/III ratio of 1950 is at the same level as the dotted line of the cancel curvature Cv0 but, conversely, exceeds it if the thickness $t_{GaN}$ becomes about 250 nm or more. The curvature Cv having the V/III ratio of 3900 or 7800 is below the cancel curvature Cv0.

If the curvature Cv is less than the cancel curvature Cv0, the warpage of the substrate which occurs during the cooling process after the crystal growth can be canceled sufficiently. On the other hand, if the curvature Cv is above the cancel curvature Cv0, the substrate warpage occurring during the cooling process after the crystal growth cannot be canceled. Consequently, it is considered that cracks occurred in the specimens having the V/III ratios of 980 and 1950, respectively.

In such a manner, cracks can be inhibited effectively from occurring by placing the curvature Cv of the substrate 40 during the crystal growth of the GaN layer below the cancel curvature Cv0.

Observation by a microscope of the surface of the fabricated device shows that the occurrence of cracks can be inhibited effectively if the product of the lattice mismatch factor LM and the maximum thickness at the time of compressive stress application tc is at least 3. The value of this product proves a measure for representing the magnitude of the product of the lattice mismatch factor LM and compressive stress.

When a practical GaN layer is formed in a case where the maximum thickness at the time of compressive stress application tc is at least 250 nm, the product of the lattice mismatch factor and the maximum thickness at the time of compressive stress application becomes larger than 3, and the effects of inhibiting the lattice mismatch factor and the occurrence of cracks is large.

A description will be given of the phenomenon that an increase in V/III ratio increases the maximum thickness at the time of compressive stress application tc during the formation of the GaN layer.

FIG. 6A to FIG. 6D are graphs illustrating characteristics of the nitride semiconductor layer.

Those figures show one example of a reflection spectrum during growth of the AlGaN layer and the GaN layer when the GaN layer (first upper layer 61b) is formed on the AlGaN layer (first lower layer 61a) having an Al composition ratio of 0.25. FIG. 6A, FIG. 6B, FIG. 6C, and FIG. 6D correspond to the V/III ratios of 980, 1950, 3900, and 7800 during the growth of the GaN layer, respectively. The horizontal axis of each of those figures gives growth time t (sec). The vertical axis gives a reflection intensity Rf (arbitrary scale) for laser light having a wavelength of 405 nm.

Figure 6A:
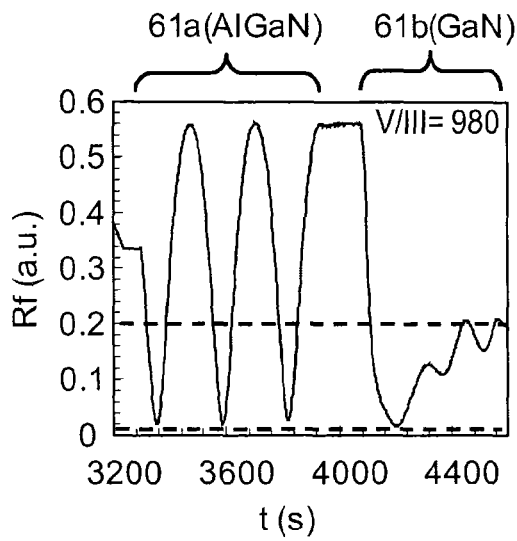
FIG. 6A to FIG. 6D are graphs showing characteristics of the nitride semiconductor layer.

As can be seen from FIG. 6A, if the V/III ratio is 980, the reflection intensity Rf decreases to almost zero at the initial stage of formation of the GaN layer (first upper layer 61b) and then increases as this layer grows. The minimum value of the reflection intensity Rf at the initial stage of formation is about 0.02.

Figure 6B:
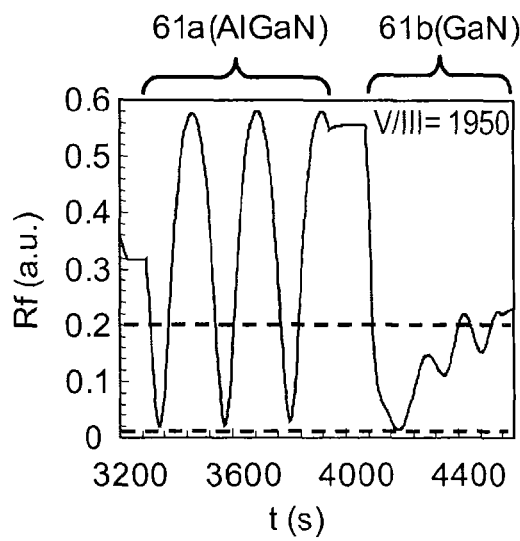
Figure 6C:
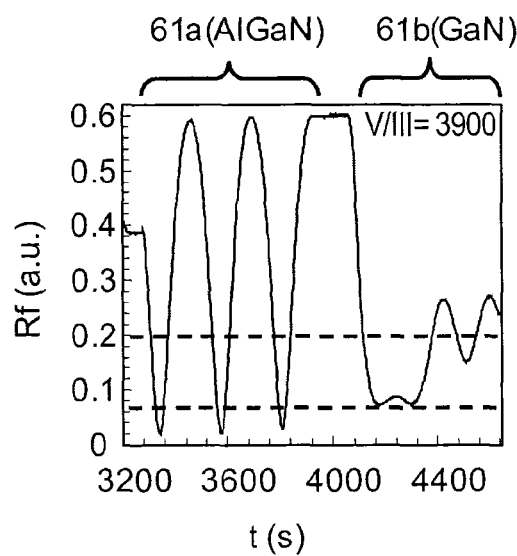
Figure 6D:
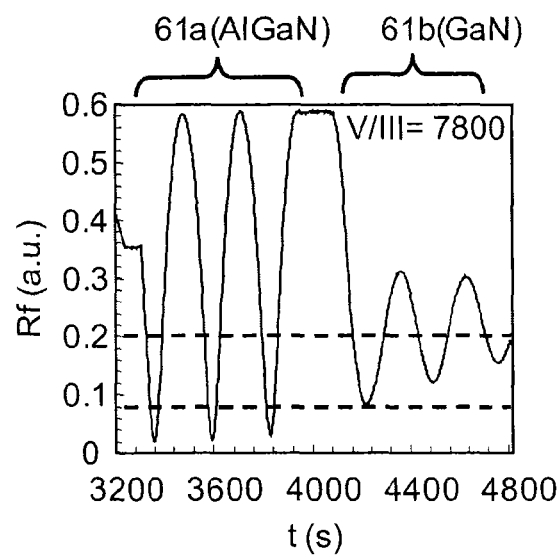

As can be seen from FIG. 6B to FIG. 6D, as the V/III ratio increases, the minimum value of the reflection intensity Rf at the initial stage of the formation of the GaN layer rises. For example, if the V/III ratio is 1950, the minimum value of the reflection intensity Rf is about 0.02, if the V/III ratio is 3900, the minimum value of the reflection intensity Rf is about 0.07, and if the V/III ratio is 7800, the minimum value of the reflection intensity Rf is about 0.09. It is found that after the reflection intensity Rf at the initial stage of the formation of the GaN layer is minimized, the amplitude of the reflection intensity Rf increases as the V/III ratio increases.

The reflection intensity Rf changes with the flatness of the surface of the crystal. As the irregularities in the crystal surface increase, the reflection intensity Rf decreases. It is considered that the flatter the film is, the larger the amplitude of the reflection intensity Rf becomes so that a clear interference vibration dependent on the grown film thickness may occur.

If the V/III ratio is at a small value of 1950 or less, the minimum value of the reflection intensity Rf at the initial stage of the growth of the GaN layer is low, and thus the irregularities in the crystal surface are considered to be large at the initial stage of the growth. Even at a stage where the growth has advanced, the surface is considered not to be so flat. If the V/III ratio is at a small value of 1950 or less, it is considered that the growth rate in the stacking direction is larger than the growth rate in a direction parallel to the crystal surface in growth of the GaN layer.

If the V/III ratio is at a large value of not less than 3900, the minimum value of the reflection intensity Rf at the initial stage of the growth of the GaN layer is large, and thus it is considered that the crystal surface is comparatively flat even at the initial stage of the growth and, as the growth advances, becomes even flatter. If the V/III ratio is at a large value of 3900 or more, it is considered that the growth rate in the direction parallel to the crystal surface becomes larger than the stack-directional growth rate in growth of the GaN layer.

No matter which value the V/III ratio has, the center value of the amplitude of a reflection spectrum when the GaN layer is formed rises as the growth time t elapses. A moment at which the center value of the amplitude of the reflection intensity Rf becomes about 0.2 corresponds to the moment at which the crystal surface becomes substantially flat.

Figure 7:
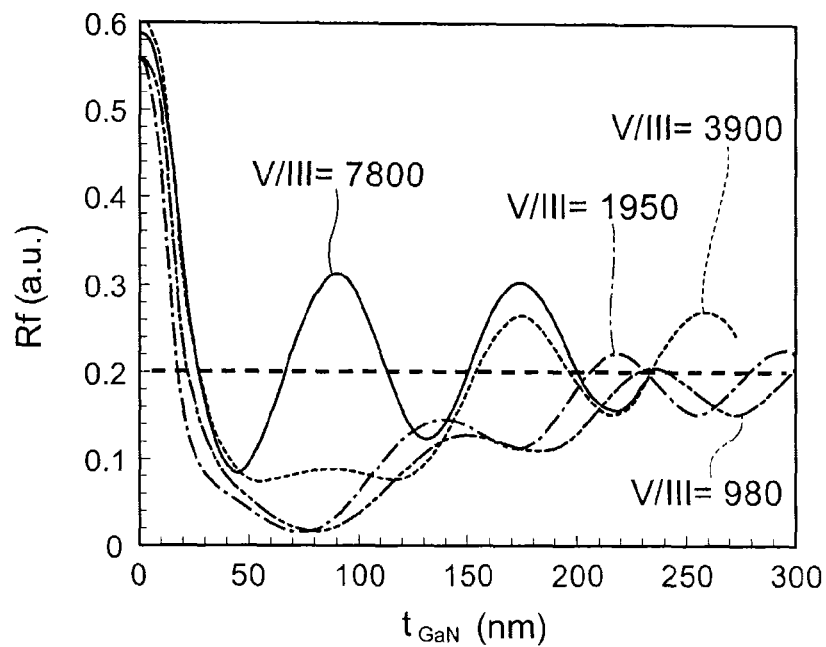
FIG. 7 is a graph showing characteristics of the nitride semiconductor layer.

FIG. 7 is a graph illustrating characteristics of the nitride semiconductor layer.

FIG. 7 shows the thickness $t_{GaN}$ along its horizontal axis obtained by extracting a reflection spectrum at the time of formation of the GaN layer (first upper layer 61b) from the reflection spectra shown in FIG. 6A to FIG. 6D. The vertical axis gives the reflection intensity Rf.

As shown in FIG. 7, in a case where the V/III ratio is 980, the center value of the amplitude of the reflection intensity Rf becomes 0.2 when the thickness $t_{GaN}$ of the GaN layer is about 300 nm. That is, when the GaN layer is formed to a thickness of 300 nm, a flat crystal surface is formed.

In a case where the V/III ratio is 1950, the center value of the amplitude of the reflection intensity Rf becomes 0.2 when the thickness $t_{GaN}$ is about 280 nm, at which thickness, a flat crystal surface is formed.

In a case where the V/III ratio is 3900, the center value of the amplitude of the reflection intensity Rf becomes 0.2 when the thickness $t_{GaN}$ is about 250 nm, at which thickness, a flat crystal surface is formed.

In a case where the V/III ratio is 7800, the center value of the amplitude of the reflection intensity Rf becomes 0.2 when the thickness $t_{GaN}$ is about 100 nm, at which thickness, a flat crystal surface is formed.

As described above, in a case where the V/III ratio is 3900 or more when the Al composition ratio is 0.25, a nitride semiconductor layer free of cracks was obtained. Based on the results, it is considered that the thickness before flattening has a great influence on the formation of cracks in formation of the GaN layer. By forming a flat surface having a film thickness of not larger than 250 nm, formation of cracks can be inhibited.

Figure 8A:
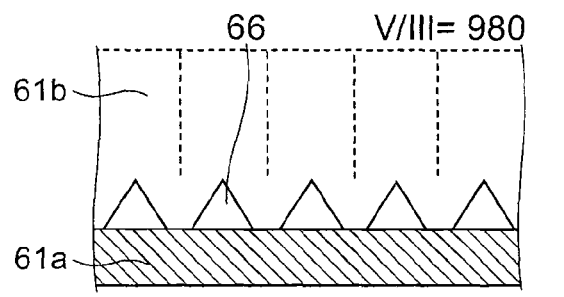
FIG. 8A to FIG. 8D are schematic cross-sectional views showing characteristics of the nitride semiconductor layer.
Figure 8C:
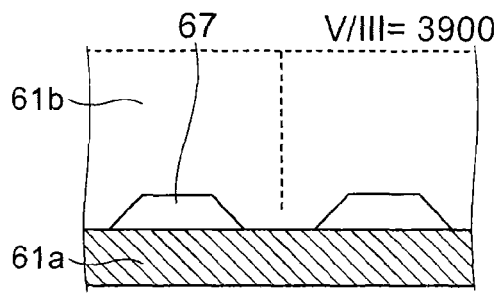
Figure 8B:
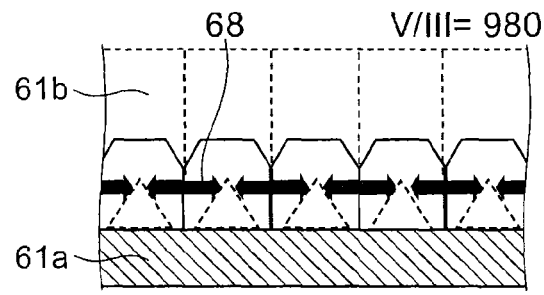
Figure 8D:
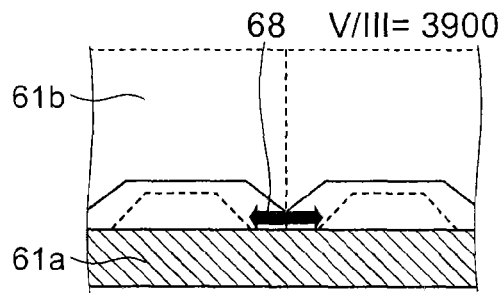

FIG. 8A to FIG. 8D are schematic cross-sectional views illustrating characteristics of the nitride semiconductor layer. Those schematic figures show an example of a growth process of growing the GaN layer (first upper layer 61b) on the AlGaN layer (first lower layer 61a). FIG. 8A shows the state of an initial growth stage in a case where the V/III ratio is small (for example, V/III ratio is 980). FIG. 8B shows the state of an advanced growth stage in a case where the V/III ratio is small. FIG. 8C shows the state of an initial growth stage in a case where the V/III ratio is large (for example, V/III ratio is 3900). FIG. 8D shows the state of an advanced growth stage in a case where the V/III ratio is large.

As shown in FIG. 8A, if the V/III is small, as described above, since the growth rate in the stacking direction is larger than the growth rate in the direction parallel to the crystal surface, irregularities including a plurality of small-diameter fine crystals 66 are formed at the initial stage of formation of the GaN layer.

As shown in FIG. 8B, as the growth advances, the formed crystals are combined with each other to promote flattening. As a result, the reflection intensity Rf increases.

On the other hand, as shown in FIG. 8C, if the V/III is large, since the growth rate in the direction parallel to the crystal surface is larger than the growth rate in the stacking direction, large-diameter crystals 67 are formed even at the initial stage of formation of the GaN layer. As a result, the irregularities are suppressed as compared to the case where the V/III ratio is small. Accordingly, a decrease in reflection intensity Rf at the initial stage of the growth is small.

As shown in FIG. 8D, the flattening of the crystal surface is accelerated, and a flat surface of the thin GaN layer can be obtained easily. Therefore, the amplitude of the interference vibration of the reflection intensity Rf becomes large.

When the fine crystals 66 are combined with each other, those crystals attract each other to give rise to tensile stress 68. A total sum of the tensile stress 68 and compressive stress which occurs due to a difference in lattice spacing between the AlGaN layer and the GaN layer (that is, the product of the lattice mismatch factor and the film thickness) determines a curvature (warpage) of the substrate at the time of formation of the nitride semiconductor layer.

In a case where the V/III ratio is small (for example, 980), the fine crystals 66 have a high density and a large height. Therefore, the large tensile stress 68 occurs at the boundary between the fine crystals 66. The tensile stress that occurs due to the combination of the crystals reduces compressive stress that occurs due to the difference in lattice spacing between the AlGaN layer and the GaN layer. Therefore, the tensile stress (strain) that occurs in the cooling process after the crystal growth is finished becomes dominant, and cracks are liable to occur.

On the other hand, if the V/III ratio is large (for example, 3900), the crystals 67 have a lower density and a small height. Therefore, the area of the crystal interface decreases to reduce the tensile stress 68 that occurs at the time of the formation of the GaN layer. As a result, the compressive stress becomes comparatively large which occurs due to the difference of the lattice spacing (lattice mismatch factor LM) between the AlGaN layer and the GaN layer. Therefore, it is possible to accumulate compressive stress sufficiently larger than the tensile stress that occurs in the cooling process after the crystal growth is finished. In this case, it is possible to enhance a convex warpage at a high temperature after the growth is finished. Further, cracks hardly occurs even with action of the tensile stress (strain) in the temperature falling after the crystal growth is finished.

In the embodiment, the condition of the V/III ratio being 2000 or more is used to make the growth rate in the direction parallel to the GaN layer crystal surface larger than the growth rate in the stacking direction, thereby being possible to inhibit tensile strain (stress) building at the time of formation of the GaN layer. As a result, cracks can be inhibited from occurring.

Further, the V/III ratio is set to not more than 8000. As described later, if the V/III ratio exceeds 8000, compressive stress is accumulated excessively to give rise to defects in the silicon substrate 40 during the growth of crystal in some cases. The excessive accumulation of stress may lead to a decrease in yield in device processes. By setting the V/III ratio to not more than 8000, it is possible to inhibit defects from occurring in the substrate 40.

In such a manner, in the embodiment, the absolute value of the ratio of the difference between a second lattice spacing of the first upper layer 61b and a first lattice spacing of the first lower layer 61a to the first lattice spacing is set to not less than 0.005 and not more than 0.019 and the growth rate (horizontal growth rate) of the first upper layer 61b in the direction parallel to the major surface 40a is made higher than the growth rate (vertical growth rate) of the first upper layer 61b in a direction perpendicular to the major surface 40a in the formation of the first upper layer 61b. Thereby, the first upper layer 61b is formed in condition where compressive stress based on the difference between the second lattice spacing and the first lattice spacing is applied on the first upper layer 61b. This makes it possible to manufacture a high-quality nitride semiconductor layer in which occurrence of crack is inhibited.

In the embodiment, the lattice spacing of the nitride semiconductor layer refers to that along the first axis parallel to the major surface 40a of the substrate 40. If a c-axis of the nitride semiconductor layer is perpendicular to the major surface 40a, an a-axis of the nitride semiconductor layer can be illustratively employed as the first axis. However, the embodiment is not limited thereto; an axis in an arbitrary direction parallel to the major surface 40a of the substrate 40 can be employed as the first axis.

FIG. 9A to FIG. 9D are schematic views illustrating the configuration of the nitride semiconductor layer.

Figure 9A:
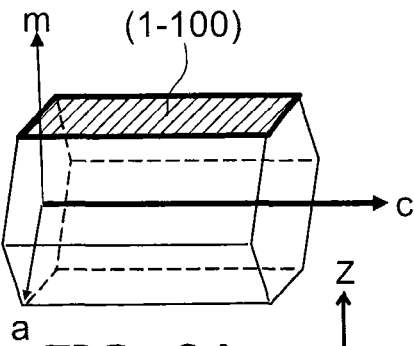
FIG. 9A to FIG. 9D are schematic views showing the nitride semiconductor layer.
Figure 9B:
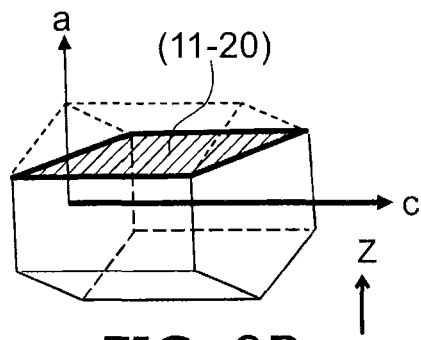

As shown in FIG. 9A and FIG. 9B, the c-axis of the nitride semiconductor layer may be perpendicular to a Z-axis direction (direction perpendicular to the major surface 40a of the substrate 40). At this time, the first axis about the lattice spacing can be made parallel to, for example, a (1-100) plane. Further, the first axis can be made parallel to, for example, a (11-20) plane.

Figure 9C:
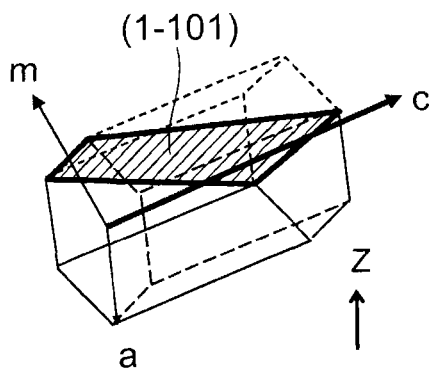
Figure 9D:
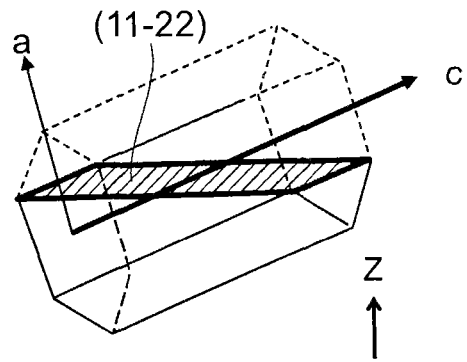

As shown in FIG. 9C and FIG. 9D, the c-axis of the nitride semiconductor layer may be inclined with respect to the Z-axis direction. At this time, the first axis about the lattice spacing can be made parallel to, for example, a (1-101) plane. Further, the first axis can be made parallel to, for example, a (11-22) plane.

Those are examples, and in the embodiment, an arbitrary axis parallel to the major surface 40a of the substrate 40 can be applied as the first axis.

Figures 10A, 10B, 10C:
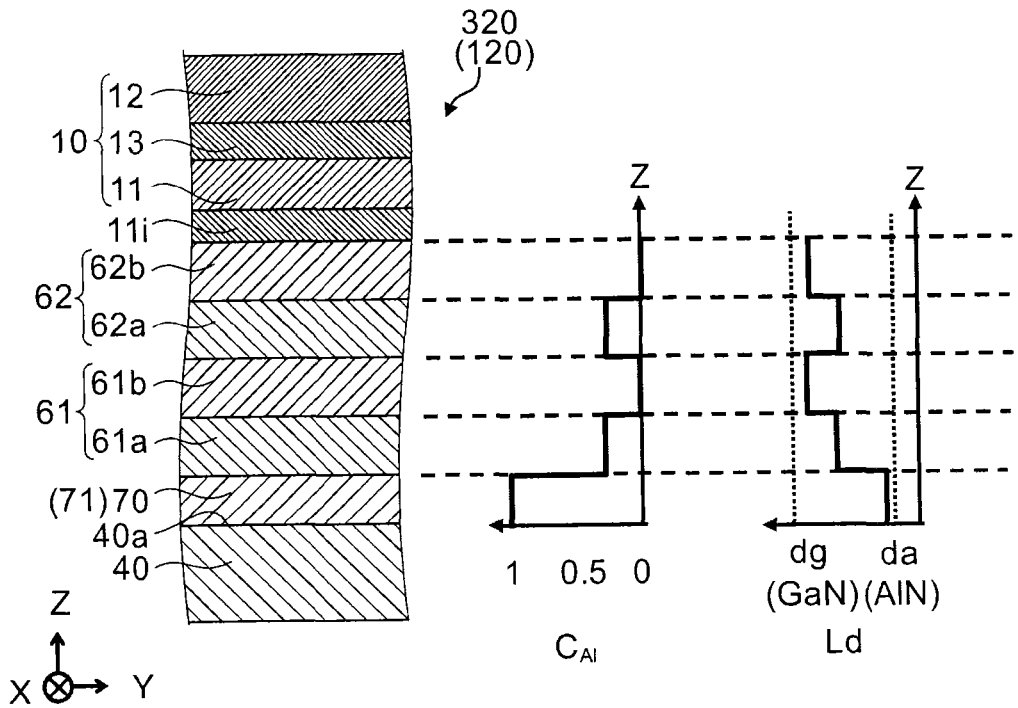
FIG. 10A to FIG. 10C are schematic views showing a nitride semiconductor layer according to the first embodiment.

FIG. 10A to FIG. 10C are schematic views illustrating another nitride semiconductor layer according to the first embodiment.

FIG. 10A is a schematic cross-sectional view illustrating the configuration of a nitride semiconductor layer 320 according to the embodiment. FIG. 10B is a graph illustrating the composition ratio ($C_{Al}$) of Al and FIG. 10C is a graph illustrating a lattice spacing Ld along an a-axis.

As shown in FIG. 10A, the nitride semiconductor layer 320 (nitride semiconductor device 120) according to the embodiment further includes a second stacked body 62 in addition to the substrate 40, the buffer layer 70 (for example, the AlN layer 71), the first stacked body 61, and the functional layer 10. The first stacked body 61 includes the first lower layer 61a and the first upper layer 61b. Between the second stacked body 62 and the functional layer 10, the GaN layer 11i (for example, an undoped GaN layer) may be provided further. The description about the substrate 40, the buffer layer 70, the first stacked body 61, and the functional layer 10 will be omitted because they are similar to those described in regard to the nitride semiconductor layer 310 (nitride semiconductor device 120). The second stacked body 62 will be described in the following.

The second stacked body 62 is provided between the first stacked body 61 and the functional layer 10. The second stacked body 62 includes a second lower layer 62a provided on the first stacked body 61 and a second upper layer 62b provided on the second lower layer 62a. The second lower layer 62a and the second upper layer 62b are made of a nitride semiconductor.

As shown in FIG. 10C, the second lower layer 62a has a third lattice spacing along the first axis (for example, a-axis) parallel to the major surface 40a of the substrate 40. The second upper layer 62b has a fourth lattice spacing along the first axis. The fourth lattice spacing is the same as the third lattice spacing or larger than the third lattice spacing.

At least a portion of the second upper layer 62b has compressive strain (a second compressive strain). For example, the lower portion (portion on the side of the second lower layer 62a) of the first upper layer 62b has compressive strain. For example, if the second upper layer 62b is thick, the upper portion of the second upper layer 62b does not have compressive strain in some cases.

As shown in FIG. 10B, as the material of the second lower layer 62a, for example, $Al_{x2}Ga_{1-x2}N$ (0<x2<1) is used. As the material of the second upper layer 62b, for example, GaN is used.

The absolute value of the ratio of a difference between the fourth lattice spacing and the third lattice spacing to the third lattice spacing is not less than 0.005 and not more than 0.019. That is, the absolute value of a lattice mismatch factor LM (second lattice mismatch factor LM2) in the second stacked body 62 is not less than 0.005 and not more than 0.019.

Figure 11:
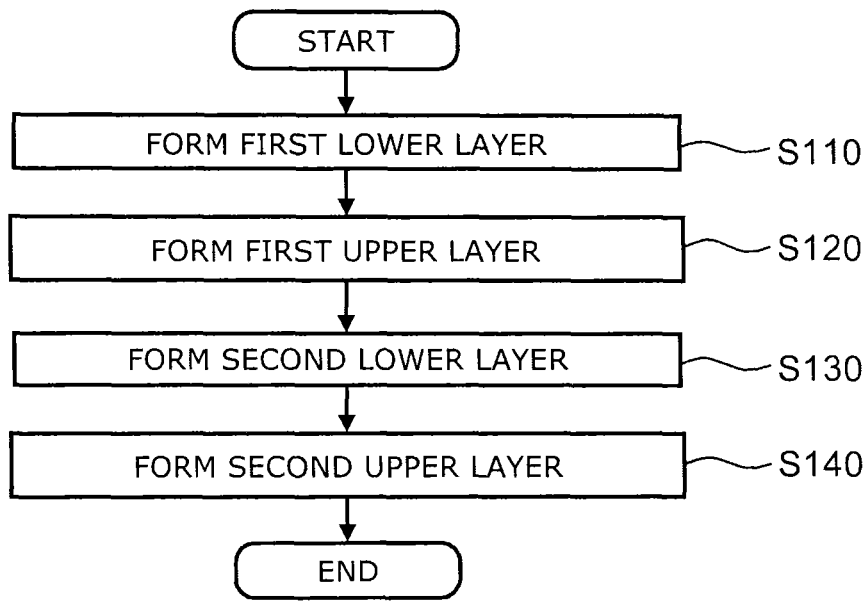
FIG. 11 is a flowchart showing a method for manufacturing the another nitride semiconductor layer according to the first embodiment.

FIG. 11 is a flowchart illustrating a method for manufacturing the another nitride semiconductor layer according to the first embodiment.

FIG. 11 illustrates an example of the method for manufacturing the nitride semiconductor layer 320 illustrated in FIG. 10.

As shown in FIG. 11, the method for manufacturing the nitride semiconductor layer of this example further includes a process of forming the second lower layer 62a on the first stacked body 61 (step S130) and forming the second upper layer 62b on the second lower layer 62a, thereby forming the second stacked body (step S140) in the manufacturing method described in regard to FIG. 2.

In the formation of the second upper layer 62b, the growth rate of the second upper layer 62b in the direction parallel to the major surface 40a of the substrate 40 is made larger than the growth rate of the second upper layer 62b in the direction perpendicular to the major surface 40a. The second upper layer 62b is formed in condition where compressive stress based on the difference between the fourth lattice spacing and the third lattice spacing is being applied on the second upper layer 62b.

That is, in this example, a plurality of stacked bodies are stacked one another, thereby enabling inhibiting the occurrence of cracks more effectively.

In this case also, the V/III ratio (which refers to a ratio of the number of atoms of the group-V element supplied for unit time to the number of atoms of the group-III element supplied for unit time) in the formation of the second upper layer 62b is preferably set to not less than 2000 and not more than 8000.

The ratio of a flow rate of ammonia gas to a total sum flow rate of a supply gas in the formation of the second upper layer 62b is preferably set to not less than 0.2 and not more than 0.5. The thickness of the second upper layer 62b is preferably set to not less than 250 nm.

Assuming a stacked body including one AlGaN layer and one GaN-made foundation layer formed on the AlGaN layer to have one period, the number periods of the stacked body is two. However, the embodiment is not limited thereto; the number of periods of the stacked body may be three or more.

In the nitride semiconductor layer according to the embodiment, an arbitrary number of the stacked body can be provided.

As described with reference to FIG. 3, as the thickness of the GaN layer increases, lattice relaxation occurs in the GaN layer, consequently the formation of compressive stress cannot be maintained. A GaN layer having a thickness smaller than that at which compressive stress cannot be formed is formed to form an AlGaN layer again on this GaN layer. This causes the lattice spacing close to that of the AlGaN layer. That is, the lattice spacing of GaN layer can be returned to a state where there is no lattice relaxation. Forming the GaN layer on this AlGaN layer allows the film thickness of the GaN layer to increase while maintaining compressive stress. That is, by stacking layers a plurality of number of times periodically, the crack inhibiting effects can be improved greatly.

In the embodiment, the configuration of the second stacked body 62 may be different from that of the first stacked body 61. When the forming the stacked body is performed multiply, the relaxation of the strain becomes easily suppressed and the compressive strain is increased. On the functional layer 10s side of the stacked body, the thickness in which the layer can be formed with applying the compressive stress to the layer is increased. Therefore, for example, the thickness of the second stacked body 62 may be thicker than the thickness of the first stacked body 61. For example, the second upper layer 62b may be thicker than the first upper layer 61b. For example, the second lower layer 62a may be thicker than the first lower layer 61a. For example, the Al composition ratio in the second lower layer 62a may be higher than that in the first lower layer 61a. For example, the amount of strain accumulated in the stacked body changes with the number of the stacked bodies. By changing the structure in accordance with a change in this amount of strain, the effects of reducing cracks and dislocations can be improved.

(Second Embodiment)

FIG. 12A to FIG. 12D are schematic views illustrating a nitride semiconductor layer according to a second embodiment.

Figures 12A, 12B, 12C, 12D:
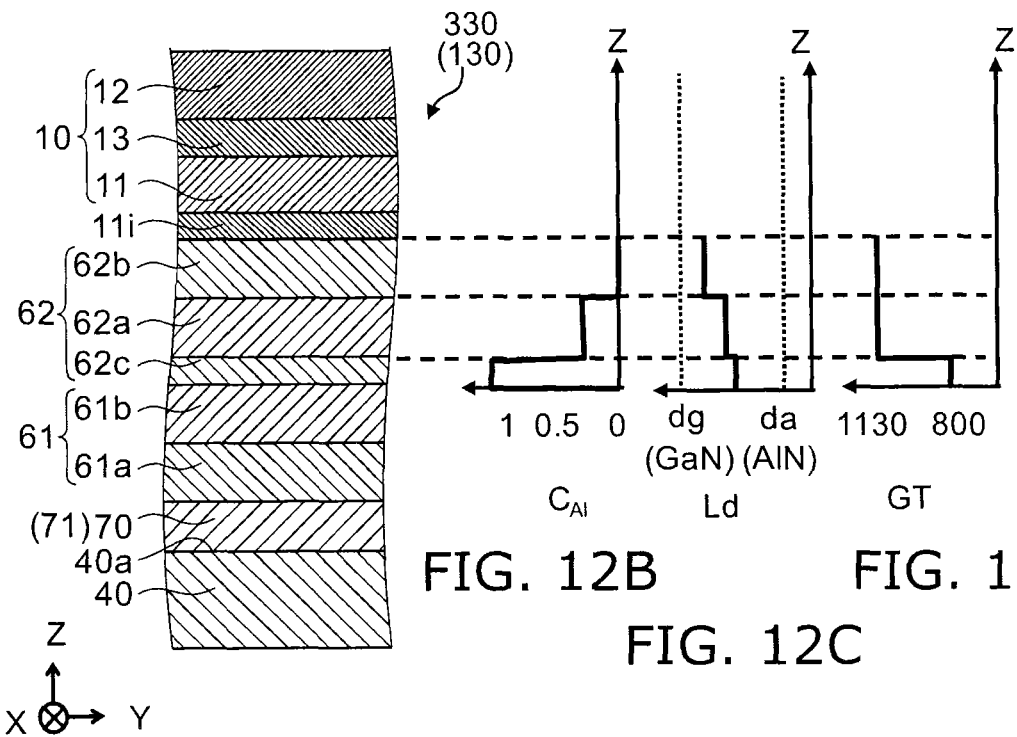
FIG. 12A to FIG. 12D are schematic views showing a nitride semiconductor layer according to a second embodiment.

FIG. 12A is a schematic cross-sectional view illustrating the configuration of a nitride semiconductor layer 330 (nitride semiconductor device 130) according to the embodiment. FIG. 12B is a graph illustrating a composition ratio of Al ($C_{Al}$), FIG. 12C is a graph illustrating a lattice spacing Ld along an a-axis, and FIG. 12D shows a growth temperature GT of the nitride semiconductor layer.

As shown in FIG. 12A, in the nitride semiconductor layer 330 (nitride semiconductor device 130), a second stacked body 62 further includes a second base layer 62c made of a nitride semiconductor. The second base layer 62c is provided between a second lower layer 62a and a first stacked body 61. The second base layer 62c has a lattice spacing along the first axis not more than a third lattice spacing of a second lower layer 62a. On the second stacked body 62 (for example, between the second stacked body 62 and a functional layer 10), a GaN layer 11i (for example, undoped GaN layer) may be provided further. The other components are almost the same as those of the nitride semiconductor layer 320 (nitride semiconductor device 120), and the description will be omitted.

That is, in a method for manufacturing the nitride semiconductor layer according to the embodiment, a process of forming the second stacked body 62 includes a process of forming the second base layer 62c made of the nitride semiconductor and having the lattice spacing along the first axis not more than the third lattice spacing on the first stacked body 61 before forming the second lower layer 62a.

As shown in FIG. 12B, the second base layer 62c is made of, for example, AlN. The second lower layer 62a is made of, for example, $Al_{x2}Ga_{1-x2}N$ (0<x2<1). The second upper layer 62b is made of, for example, GaN.

As shown in FIG. 12C, the lattice spacing Ld in the second stacked body 62 is small in a second base layer 61c and large in a second upper layer 62b. A lattice spacing (for example, lattice spacing along the a-axis) perpendicular to the stacking direction (Z-axis direction) is largest in the second upper layer 62b and becomes rapidly small in the second base layer 62c. The lattice spacing in the second lower layer 62a is larger than or the same as that in the second base layer 62c (AlN layer). The lattice spacing in the second upper layer 62b is larger than or the same as that in the second base layer 62c.

By providing the second base layer 62c (AlN layer) in such a manner, the lattice spacing becomes close to a lattice spacing (lattice constant) of a unstrained AlN layer. That is, the lattice spacing can be returned to a state in which there is less lattice relaxation of the first upper layer 61b (GaN layer). By forming an AlGaN layer as the second lower layer 62a on this second base layer 62c (AlN layer), larger compressive stress can be formed in the second upper layer 62b (GaN layer). Stress occurring due to a difference in lattice spacing can bend dislocations to reduce the dislocations that reach a semiconductor layer (for example, the functional layer 10) which is formed on the second stacked body 62.

As shown in FIG. 12D, the growth temperature GT of the second base layer 62c, for example, is lower than the growth temperature GT of the second lower layer 62a and the growth temperature GT of the second upper layer 62b.

The growth temperature GT of the AlN layer serving as the second base layer 62c preferably is, for example, not less than 500° C. and not more than 1050° C. More preferably, it is not less than 600° C. and not more than 850° C. If the growth temperature GT of the AlN is less than 500° C., an impurity is liable to be taken in. Further, cubical crystal AlN etc. may grow to give rise to crystal dislocations excessively. Then, the crystal quality of the AlN layer deteriorates excessively. On the other hand, if the growth temperature GT of the AlN layer is higher than 1050° C., lattice relaxation hardly occurs. Therefore, strain is not relaxed and tensile strain may be easily introduced into the AlN layer. Moreover, cracks are liable to occur during the cooling process after the growth is finished because compressive stress cannot appropriately be applied when forming an AlGaN layer serving as the second lower layer 62a (and the functional layer 10 etc.) on the AlN layer.

As shown in FIG. 12C, if the growth temperature GT of the AlN layer is, for example, 800° C., lattice relaxation easily occurs in the AlN layer. As a result, it is possible to form the AlN layer being less of an influence of strain from the GaN layer of the first upper layer 61b. That is, from the initial stage of formation of the AlN layer, the formation is hardly affected by tensile strain from the GaN layer of the first upper layer 61b. In such a manner, the lattice-relaxed AlN layer (second base layer 61c) is formed on the GaN layer (first upper layer 61b).

The thickness of the second base layer 62c (AlN layer) is preferably, for example, not less than 5 nm and not more than 100 nm. If the thickness of the AlN layer is less than 5 nm, the AlN layer is hard to be relaxed sufficiently. If the thickness of the AlN layer is more than 100 nm, the crystal quality of the AlN layer deteriorates easily. For example, the surface flatness easily deteriorates and thus pits may occur easily. The thickness of the AlN layer is more preferably not more than 30 nm. If the thickness of the AlN layer is not more than 30 nm, the crystal quality is inhibited from further deteriorating. The thickness of the AlN layer is, for example, about 12 nm.

Besides AlN, the second base layer 62c could be of $Al_{y2}Ga_{1-y2}N$ ($0<y2\leq1$) having a first axial lattice spacing not more than the third lattice spacing of the second lower layer 62a. The Al composition ratio in $Al_{y2}Ga_{1-y2}N$ is preferably, for example, not less than 0.5 and not more than 1.0, for example, about 1.0. If the Al composition ratio in the second base layer 62c is less than 0.5, the second base layer 62c is hard to be relaxed sufficiently.

Here, as a parameter denoting the degree of relaxation of strain (lattice relaxation) of the second base layer 62c, relaxation rate α is introduced. The relaxation rate α of the second base layer 62c (AlN layer) is assumed to be a ratio of the absolute value of a difference between a lattice spacing dg of an axis equivalent to the first axis (axis parallel to the major surface 40a) of unstrained GaN and an actual lattice spacing Da of the first axis in the second base layer 62c to the absolute value of a difference between the lattice spacing dg of the axis equivalent to the first axis of unstrained GaN and a lattice spacing da of the axis equivalent to the first axis of unstrained AlN. That is, the relaxation rate $\alpha=|dg-Da|/|dg-da|$.

In a case where the second base layer 62c is made of $Al_{y2}Ga_{1-y2}N$ ($0<y2\leq1$), the relaxation rate α is assumed to be a ratio of the absolute value of a difference between a lattice spacing dg of an axis equivalent to the first axis (axis parallel to the major surface 40a) of unstrained GaN and an actual lattice spacing Da of the first axis in the second base layer 62c to the absolute value of a difference between the lattice spacing dg of the axis equivalent to the first axis of unstrained GaN and a lattice spacing da of the axis equivalent to the first axis of unstrained $Al_{y2}Ga_{1-y2}N$ ($0<y2\leq1$).

The lattice spacing (lattice constant) of the first axis of unstrained $Al_{y2}Ga_{1-y2}N$ ($0<y2\leq1$) is, for example, a value calculated using the Vegard's law from the lattice spacing (lattice constant) of the first axis of unstrained AlN and the lattice spacing (lattice constant) of the first axis of unstrained GaN.

The relaxation rate α of the second base layer 62c (AlN layer) changes with the growth temperature GT as described above. For example, if the growth temperature GT of AlN of the second base layer 62c at its growth time is 1130° C., the relaxation rate a of AlN is 0.43 and, if the GT is 650° C., it is 0.71. In such a manner, if the growth temperature is low, the relaxation rate α becomes large. To increase the relaxation rate α, the growth temperature is preferably lower than the growth temperature GT of the first upper layer 61b (GaN layer) in formation.

Further, the relaxation rate α changes also with the growth rate. For example, if the growth rate of AlN of the second base layer 62c is 8.82 nm/min, it is 0.35, and if the growth rate if 3.92 nm/min, it is 0.57. In such a manner, if the growth rate is low, the relaxation rate α becomes large. To increase the relaxation rate α, the growth rate is preferably lower than the growth rate of the first upper layer 61b (GaN layer) in formation. For example, it is preferably not less than 2 nm/min and not more than 10 nm/min. More preferably, it is not less than 3 nm/min and not more than 8 nm/min.

Further, the relaxation rate α changes also with the partial pressure of ammonia. For example, if the ammonia's partial pressure of AlN of the second base layer 62c is 0.009, the relaxation rate α is 0.43, and if the partial pressure is 0.43, it is 0.72. In such a manner, if the ammonia's partial pressure is large, the relaxation rate a becomes large. To increase the relaxation rate α, the ammonia's partial pressure is preferably, for example, not less than 0.01 and not more than 0.5. If the ammonia's partial pressure is less than 0.01, the second base layer 62c is hard to be relaxed sufficiently. If the ammonia's partial pressure is more than 0.5, vapor phase reaction becomes excessive between ammonia as the group-V atom material gas and ammonia as the group-III atom material gas, to deteriorate the crystal quality of the second base layer 62c (AlN layer).

Moreover, the relaxation rate α changes also with a ratio (V/III ratio) between the group-V atom material gas and the group-III atom material gas. The V/III ratio refers to a ratio of the number of atoms of the group-V element supplied for unit time to the number of atoms of the group-III element supplied for unit time. For example, if the V/III ratio of AlN as the second base layer 62c is 1800, the relaxation rate α is 0.44, and if the ratio is 22600, it is 0.72. In such a manner, if the V/III ratio is large, the relaxation rate a becomes large. To increase the relaxation rate α, the V/III ratio is preferably, for example, not less than 1500 and not more than 100000. If the V/III ratio is less than 1500, the second base layer 62c is hard to be relaxed sufficiently. If the V/III ratio is more than 100000, vapor phase reaction becomes excessive between ammonia as the group-V atom material gas and ammonia as the group-III atom material gas, to deteriorate the crystal quality of the second base layer 62c (AlN layer).

The relaxation rate a being large corresponds to the actual lattice spacing Da of the AlN layer being small.

However, if the second base layer 62c (AlN layer) undergoes lattice relaxation completely and the actual lattice spacing Da of the second base layer 62c (AlN layer) is equal to the lattice spacing da (for example, lattice constant of a-axis) of unstrained AlN, crystal information of the first upper layer 61b (GaN layer) cannot be inherited to give rise to crystal axis fluctuations, thereby greatly deteriorating the crystal quality. Misfit dislocations accompanying the lattice relaxation increase to deteriorate the crystal quality. Therefore, the lattice spacing Da (for example, lattice spacing of a-axis) of the second base layer 62*c* (AlN layer) is preferably larger than the lattice spacing da (for example, a-axial lattice constant) of unstrained AlN.

On the second base layer 62*c*, the second lower layer 62*a* (AlGaN layer) is formed. The Al composition ratio in the second lower layer 62*a* (AlGaN layer) is preferably not more than the relaxation rate $\alpha$ of the second base layer 62*c* (AlN layer). That is, it is preferable that the second lower layer 62*a* (AlGaN layer) has a tensile stress.

At this time, a lattice constant perpendicular to the stacking direction (Z-axis direction) of the AlGaN layer is larger than an actual lattice spacing of the AlN layer. The AlGaN layer is formed so that it may match the lattice of the AlN layer and grows as receiving compressive strain. Accordingly, the actual lattice spacing (third lattice spacing Dag) perpendicular to the stack direction (Z-axis direction) of the AlGaN layer becomes not less than the actual lattice spacing Da of the AlN layer.

On the other hand, if the Al composition ratio in the AlGaN layer is larger than the relaxation rate $\alpha$ of the AlN layer, the lattice spacing perpendicular to the stacking direction (Z-axis direction) of the AlGaN layer is less than the actual lattice spacing of the AlN layer. Therefore, the second lower layer 62*a* (AlGaN layer) grows as receiving tensile strain, to make the third lattice spacing Dag of the AlGaN layer smaller than the actual lattice spacing Da along the a-axis of the AlN layer, consequently tensile strain occurs and cracks are liable to occur.

That is, only by simply forming the second lower layer 62*a* (AlGaN layer) with a smaller Al composition ratio than that of the second base layer 62*c* (AlN layer) on the second base layer 62*c* (AlN layer), no compressive strain is formed, and thus cracks cannot easily be inhibited from occurring. By forming AlGaN layers having a lattice constant larger than the actual lattice spacing of the AlN layer on the second base layer 62*c* (AlN layer) with a lattice spacing smaller than the lattice constant, the AlGaN layer grows as receiving compressive strain and thus the compressive strain is accumulated in the surface of the substrate 40. It is preferably to form an AlGaN layer having an Al composition ratio on which the relaxation rate $\alpha$ of the AlN layer is reflected, that is, an AlGaN layer whose Al composition ratio is not more than the relaxation rate a of the AlN layer.

The thickness of the second lower layer 62*a* (AlGaN layer) is preferably, for example, not less than 5 nm and not more than 100 nm. If the thickness of the AlGaN layer is less than 5 nm, it is hard to obtain the effects of inhibiting crack occurrence and the effects of reducing dislocations. If the thickness of the AlGaN layer is more than 100 nm, not only the effects of reducing the dislocations are saturated but also cracks are liable to occur. The thickness of the AlGaN layer is more preferably less than 50 nm. By setting the thickness of the AlGaN layer less than 50 nm, the dislocation density can be reduced effectively. The thickness of the AlGaN layer is, for example, about 25 nm.

In a state where the thickness is small (at the initial stage of growth), $Al_xGa_{1-x}N$ is formed so that it matches the lattice constant of AlN and grows as receiving compressive strain. Then, as $Al_xGa_{1-x}N$ grows, the lattice is relaxed gradually, consequently the lattice spacing of $Al_xGa_{1-x}N$ becomes close to that of unstrained $Al_xGa_{1-x}N$. When $Al_xGa_{1-x}N$ has grown as receiving compressive strain, the compressive strain is accumulated in the substrate surface and thus upward convex warpage occurs in the substrate. By accumulating the compressive strain during the growth of crystal beforehand, it is possible to inhibit the occurrence of cracks which occur due to a difference in thermal expansion coefficient during the cooling process after the growth is finished. It is possible to reduce cracks and dislocations by controlling the Al compression ratio on which the relaxation rate $\alpha$ of the AlN layer is reflected and the film thickness.

The second lower layer 62*a* (AlGaN layer) may include a plurality of layers stacked one another. For example, the Al composition ratio of the AlGaN layer may decrease stepwise or gradually in a direction from the first stacked body 61 toward the second stacked body 62. This makes it possible to inhibit the lattice relaxation of the AlGaN layer, and increase compressive strain formed in the AlGaN layer. The dislocations bend at boundaries of the AlGaN layer (a boundary between the AlN layer and the AlGaN layer, and/or a boundary between the AlGaN layer and the GaN layer). As a result, the dislocations which reach the functional layer 10 are reduced.

As shown in FIG. 12C, the growth temperature GT of the second lower layer 62*a* (AlGaN layer) is, for example, 1130° C. If the growth temperature of the AlGaN layer is higher than the AlN layer's growth temperature by 80° C. or more, effects become larger of this layer growing so that it matches the lattice spacing of AlN. For example, if the growth temperature of the AlGaN layer is not less than 1050° C., its thickness that it matches the lattice spacing in growth increases. As a result, compressive strain is applied easily, thereby making it easy to inhibit crack occurrence. The effects of reducing dislocations become larger.

A total sum of the thickness of the second base layer 62*c* (AlN layer), the thickness of the second lower layer 62*a* (AlGaN layer), and the thickness of the second upper layer (GaN layer) is preferably, for example, not less than 50 nm and not more than 2000 nm. In the case where the total sum of the thickness is less than 50 nm, the compressive stress is hard to be generated and the number of the stacking to suppress the crack increases. In the case where the number of stacks of these layers is large, the number of the heating processes and cooling processes for the growth temperature GT to obtain the desired thickness of the stacked body 50 increases excessively. Thereby, the crystal quality decreases by the excessive change of the temperature. Further, the productivity decreases. If the total sum of the thickness is larger than 2000 nm, the lattice relaxation easily occurs. As a result, compressive strain is not sufficiently accumulated so that cracks occur easily. The total sum of the thickness is more preferably not less than 300 nm and not more than 1000 nm. By setting the total sum of the thickness not less than 300 nm and not more than 1000 nm, a flat surface is easily obtained and thus effects of reducing cracks and dislocations may be more effective.

A portion of at least one of the first upper layer 61*b* (GaN layer) and the second upper layer 62*b* (GaN layer) may be provided with a δ-doped layer of Si.

Figure 17A:
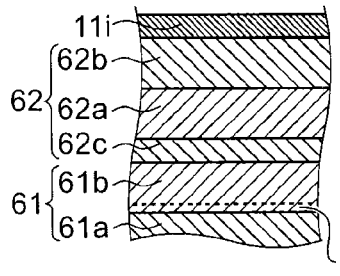
FIG. 17A to FIG. 17L are schematic views showing the configuration of nitride semiconductor layers according to the embodiments.
Figure 17B:
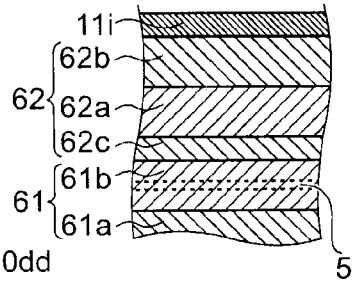
Figure 17C:
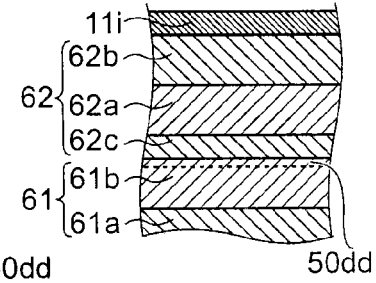

For example, as shown in FIG. 17A, the δ-doped layer 50*dd* may be provided on the surface of the first upper layer 61*b* on the first lower layer 61*a* side. As shown in FIG. 17B, the δ-doped layer 50*dd* may be provided in the interior of the first upper layer 61*b*. As shown in FIG. 17C, the δ-doped layer 50*dd* may be provided on the surface of the first upper layer 61*b* on the functional layer 10 side (for example, the second base layer 62*c*).

Figure 17D:
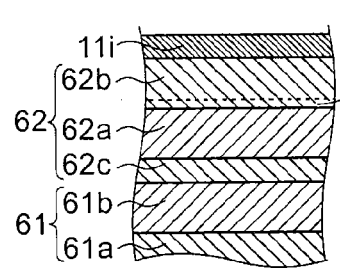
Figure 17E:
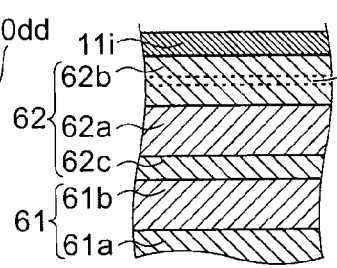
Figure 17F:
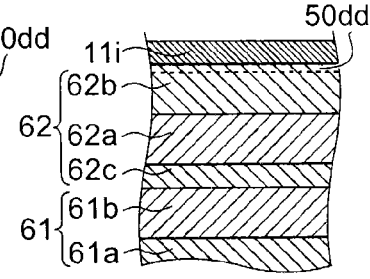

As shown in FIG. 17D, the δ-doped layer 50*dd* may be provided on the surface of the second upper layer 62*b* on the second lower layer 62*a* side. As shown in FIG. 17E, the δ-doped layer 50*dd* may be provided in the interior of the second upper layer 62*b*. As shown in FIG. 17F, the δ-doped layer 50*dd* may be provided on the surface of the second upper layer 62*b* on the functional layer 10 side (for example, on the GaN layer 11*i* side).

Further, a portion of at least one of the first lower layer 61a (AlGaN layer) and the second lower layer 62a (AlGaN layer) may be provided with the δ-doped layer 55dd of Si.

Figure 17G:
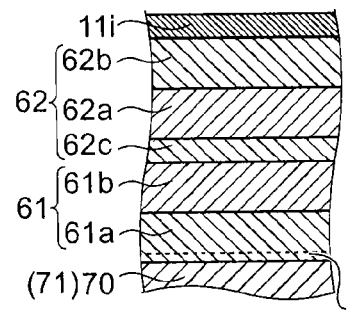
Figure 17H:
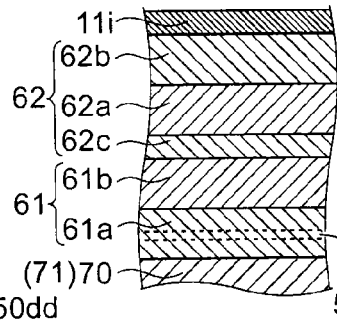
Figure 17I:
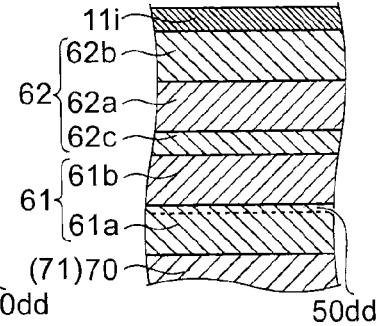

For example, as shown in FIG. 17G, the δ-doped layer 50dd may be provided on the surface of the first lower layer 61a on the buffer layer 70 side. As shown in FIG. 17H, the δ-doped layer 50dd may be provided in the interior of the first lower layer 61a. As shown in FIG. 17I, the δ-doped layer 50dd may be provided on the surface of the first lower layer 61a on first upper layer 61b.

Figure 17J:
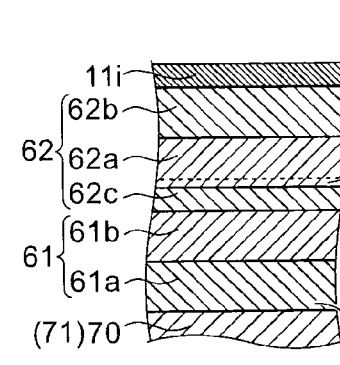
Figure 17K:
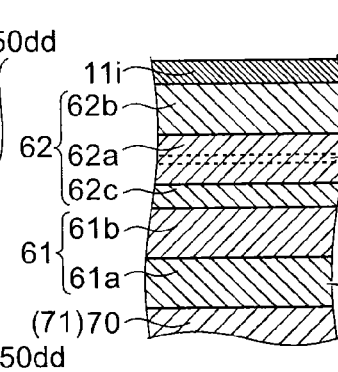
Figure 17L:
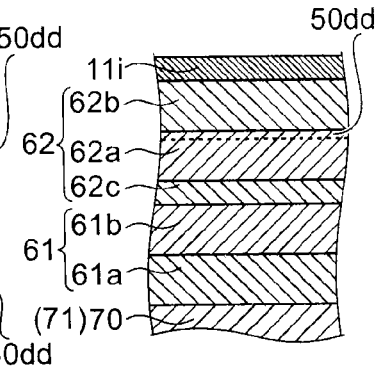

As shown in FIG. 17J, the δ-doped layer 50dd may be provided on the surface of the second lower layer 62a on the second base layer 62C side. As shown in FIG. 17K, the δ-doped layer 50dd may be provided in the interior of the second lower layer 62a. As shown in FIG. 17L, the δ-doped layer 50dd may be provided on the surface of the second lower layer 62a on the second upper layer 62b.

The δ-doped layer 50dd may include, for example, a layer that contains Si with a concentration of not less than $5\times10^{17}$ cm$^{-3}$ and not more than $2\times10^{19}$ cm$^{-3}$.

By providing the δ-doped layer 50dd with such Si concentration, the compressive stress of the GaN layer (for example, the GaN layer 11i) formed on the δ-doped layer 50dd is increased and the crack can be suppressed more effectively.

Alternately, the δ-doped layer 50dd may include, for example, a layer that contains Si with a concentration of not less than $7\times10^{19}$ cm$^{-3}$ and not more than $5\times10^{20}$ cm$^{-3}$. By providing these δ-doped layers 50dd, shielding of the dislocations or bending of the dislocations occur at the δ-doped layer 50dd; and the dislocations that would reach the semiconductor layer (e.g., the functional layer 10) that is formed on the δ-doped layer 50dd can be reduced more effectively.

The concentration of Si in the δ-doped layer 50dd can be measured by a secondary ion secondary mass spectrometry (SIMS). In the SIMS measurement of the Si concentration of the δ-doped layer 50dd with thin thickness, there is case in which the measured result of the Si concentration shows a spreading profile in the thickness direction. In such a case, the Si concentration can be obtained from a value of Si sheet density. The Si sheet density is a value obtained by an integration of Si concentration in the depth direction (in the thickness direction). For example, the sheet density can be calculated to be a value of a total sum of Si atoms obtained by the integration in the area of the thickness of 200 nm in the thickness direction with a center for the Si concentration peak. For example, the Si concentration measured by SIMS of about $2\times10^{20}$ cm$^{-3}$ corresponds to the sheet density of about $1\times10^{15}$ cm$^{-2}$. Therefore, the Si concentration of the δ-doped layer 50dd not less than $5\times10^{17}$ cm$^{-3}$ and not more than $2\times10^{19}$ cm$^{-3}$ corresponds the sheet density not less than $2.5\times10^{12}$ cm$^{-2}$ and not more than $1\times10^{14}$ cm$^{-2}$. The Si concentration of the δ-doped layer 50dd not less than $7\times10^{19}$ cm$^{-3}$ and not more than $5\times10^{20}$ cm$^{-3}$ corresponds the sheet density not less than $3.5\times10^{14}$ cm$^{-2}$ and not more than $2.5\times10^{15}$ cm$^{-2}$.

For example, the thickness of the δ-doped layer 50dd is not less than 0.3 nm and not more than 200 nm. However, the concentration and the thickness are not limited thereto. The δ-doped layer 50dd may include a SiN layer in which a part of Si is bonded to nitrogen. The δ-doped layer 50dd may be formed in non-continuous configuration as well as in continuous configuration.

In the case of using the AlN layer 71 as the buffer layer 70 illustrated in FIG. 12A, the first stacked body 61 can be considered to include the AlN layer 71 which is provided under the first lower layer 61a. In this case, the process of forming the first stacked body 61 includes a process of forming a first base layer (for example, AlN layer 71) which is made of a nitride semiconductor and has a lattice spacing of the first axis smaller than the first lattice spacing on the major surface 40a before forming the first lower layer 61a. The first base layer is made of $Al_{y1}Ga_{1-y1}N$ (0<y1≤1). The first lower layer 61a is made of $Al_{x1}x1Ga_{1-x1}N$ (0<x1<1, x1<y1). The first upper layer 61b is made of GaN.

In the embodiment shown in FIG. 12A, the second base layer 62C, the second lower layer 61a, and the second upper layer 62b may be considered to be the first base layer, the first lower layer, and the first upper layer, respectively.

FIG. 13A to FIG. 13D are schematic views illustrating another nitride semiconductor layer according to the second embodiment.

Figures 13A, 13B, 13C, 13D:
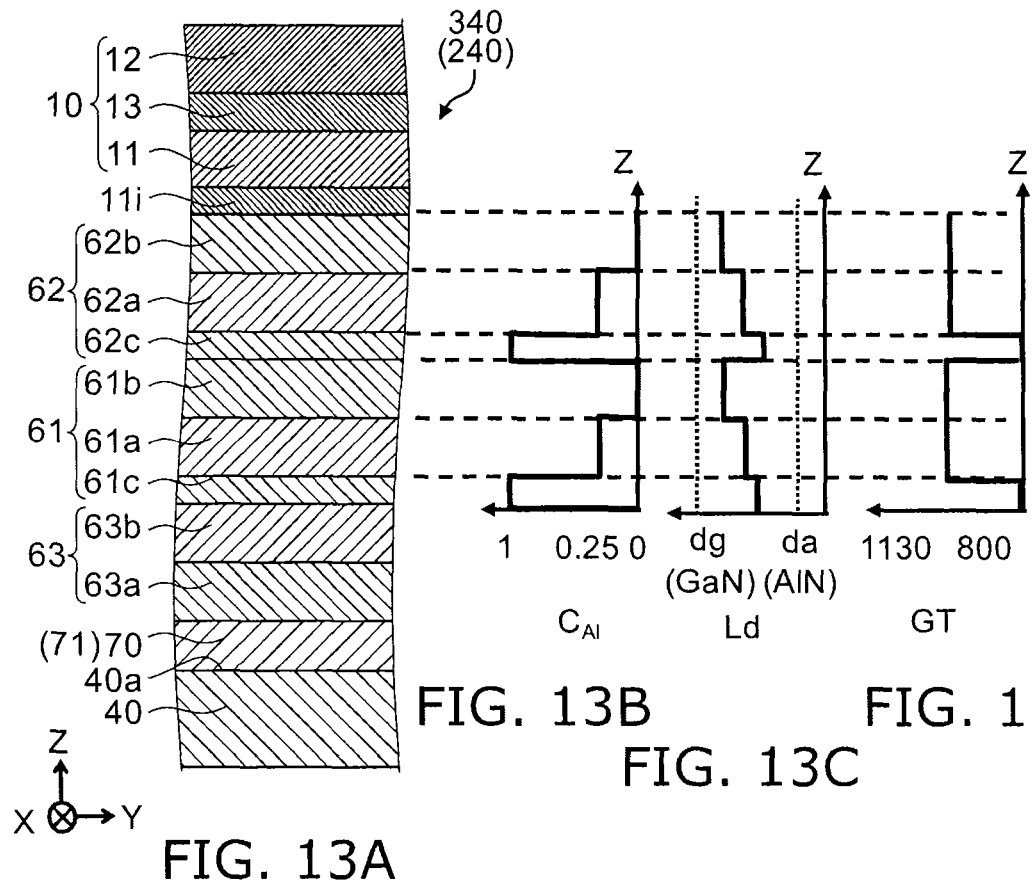
FIG. 13A to FIG. 13D are schematic views showing another nitride semiconductor layer according to the second embodiment.

FIG. 13A is a schematic cross-sectional view illustrating a configuration of a nitride semiconductor layer 340 (nitride semiconductor device 140) according to the embodiment. FIG. 13B illustrates a composition ratio ($C_{Al}$) of Al, FIG. 13C is a graph illustrating a lattice spacing Ld along an a-axis, and FIG. 13D shows the growth temperature GT of the nitride semiconductor layer.

As shown in FIG. 13A, in the nitride semiconductor layer 340 (nitride semiconductor device 140), the first stacked body 61 further includes first base layer 61. The first base layer 61c is provided between the substrate 40 and the first lower layer 61a. The first base layer 61c has a lattice spacing along the first axis smaller than the first lattice spacing of the first lower layer 61a. The second stacked body 62 further includes the second base layer 62c made of a nitride semiconductor. The second base layer 62c is provided between the second lower layer 62a and the first stacked body 61. The second base layer 62c has a lattice spacing along the first axis smaller than the third lattice spacing of the second lower layer 62a. Another stacked body 63 is provided between the first stacked body 61 and the substrate 40 (specifically, between the first stacked body 61 and the buffer layer 70). The stacked body 63 includes a lower layer 63a provided on the buffer layer 70 and an upper layer 63b provided on the lower layer 63a. The GaN layer 11i (for example, an undoped GaN layer) may be provided further between the second stacked body 62 and the functional layer 10. The other components are almost the same as those of the nitride semiconductor layer 330 (nitride semiconductor device 130), and the description will be omitted.

The first base layer 61c is made of $Al_{y1}Ga_{1-y1}N$ (0<y1≤1), the first lower layer 61a is made of $Al_{x1}Ga_{1-x1}N$ (0<x1<1, x1<y1), and the first upper layer 61b is made of GaN. The second base layer 62c is made of $Al_{y2}Ga_{1-y2}N$ (0<y2≤1), the second lower layer 62a is made of $Al_{x2}Ga_{1-x2}N$ (0<x2<1, x2<y2), and the second upper layer 62b is made of GaN. The lower layer 63a is made of $Al_{x3}ga_{1-x3}N$ (0<x3<1) and the upper layer 63b is made of GaN.

Also when manufacturing a nitride semiconductor layer having such a configuration, the manufacturing method which is described with reference to FIG. 11 is applied. As a result, a method for reducing the crack occurrence in the nitride semiconductor layer.

The results of an experiment conducted by the inventors of the application will be further described.

In the experiment, a nitride semiconductor layer (nitride semiconductor device) having the configuration described with reference to FIG. 12A to FIG. 12D was manufactured. However, in the experiment, four layers of stacked bodies are stacked. Test specimens were manufactured as follows.

The silicon substrate 40 is processed in the same way as described above, to be introduced into a reaction chamber of an MOCVD system and heated to 1080° C., and then an AlN layer is formed which provides the buffer layer 70 by using TMAl and NH₃ at a growth pressure of 400 hPa. NH₃ is supplied at a rate of 1 L/min and TMAl is supplied at a rate of 25 cc/min. The thickness of the AlN layer is about 100 nm.

The substrate 40 is set to a temperature of 1050° C. to form the AlGaN layer (first lower layer 61a) having an Al composition ratio of 0.25 by using TMGa and TMAl in an atmosphere containing nitrogen and hydrogen at a growth pressure of 400 hPa. NH₃ is supplied at a rate of 2.5 L/min, TMAl is supplied at a rate of 25 cc/min, and TMGa is supplied at a rate of 18 cc/min. The thickness of the AlGaN layer is about 250 nm.

The substrate 40 is set to a temperature of 1090° C. to form the GaN layer (first upper layer 61b) by using TMGa and ammonia in an atmosphere containing nitrogen and hydrogen at a growth pressure of 1013 hPa. NH₃ is supplied at a rate of 20 L/min and TMGa is supplied at a rate of 47 cc/min. A ratio between ammonia as the group-V material gas and TMGa as the group-III material gas, that is the V/III ratio is 3900. The thickness of the GaN layer is about 300 nm.

The substrate 40 is set to a temperature of 800° C. to form the AlN layer (second base layer 62c) by using TMAl and ammonia in an atmosphere containing nitrogen and hydrogen at a growth pressure of 400 hPa. The thickness of the AlN is about 12 nm. NH₃ is supplied at a rate of 1 L/min and TMAl is supplied at a rate of 17 cc/min. The relaxation rate α of the AlN layer is about 0.57. The relaxation rate α is measured by X-ray diffraction measurement.

The substrate 40 is set to a temperature of 1130° C. to form the AlGaN layer (second lower layer 62a) having an Al composition ratio of 0.25 by using TMGa, TMAl, and ammonia at a growth pressure of 400 hPa. The thickness of the formed AlGaN layer is about 25 nm. NH₃ is supplied at a rate of 2.5 L/min, TMAl is supplied at a rate of 18 cc/min, and TMGa is supplied at a rate of 6 cc/min.

The substrate 40 is set to a temperature of 1090° C. to form the GaN layer (second upper layer 62b) by using TMGa and ammonia in an atmosphere containing nitrogen and hydrogen at a growth pressure of 1013 hPa. The thickness of the GaN layer is about 300 nm. The growth conditions for the GaN layer are almost the same as those for the first upper layer 61b.

A stacked body combining the AlN layer (second base layer 62c), the AlGaN layer (second lower layer 62a), and the GaN layer (second upper layer 62b) is formed by repeating the processing three times more.

The substrate 40 is set to a temperature of 1090° C. to form an n-type GaN layer (with a thickness of about 1 μm) on the stacked body by using TMGa, ammonia, and silane (SiH₄) as an impurity material gas in an atmosphere containing nitrogen and hydrogen at a growth pressure of 1013 hPa. The n-type GaN layer provides the functional layer 10. NH₃ is supplied at a rate of 20 L/min and TMGa is supplied at a rate of 47 cc/min. The V/III ratio is 3900. The Si concentration in the n-type GaN layer is $5.0 \times 10^{18}$ cm⁻². In the experiment, the lattice mismatch factor LM of each of the stacked body was 0.009.

In the experiment, by changing the growth conditions for the GaN layers (the first upper layer 61b, the second upper layer 62b, etc.) other than the n-type GaN layer, a nitride semiconductor layer (nitride semiconductor device) was formed as follows.

In growth of the GaN layer, the flow rate of ammonia was changed to 5, 10, 20, 40, and 50 L/min. At this time, the ratio between ammonia as the group-V material gas and TMGa as the group-III material gas, that is, the V/III ratio is 980, 1950, 3900, 7800, and 9700, respectively.

In such a manner, five specimens having different ammonia flow rates during the formation of the GaN layer were manufactured to evaluate warpage of the substrate, cracks, and substrate defects.

Figure 14:
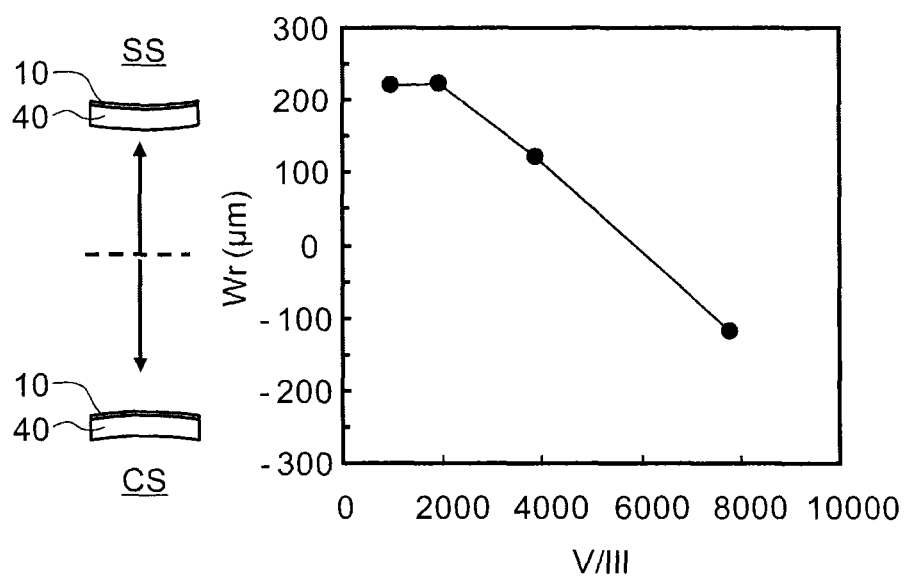
FIG. 14 is a graph showing characteristics of the nitride semiconductor layer according to the embodiment.

FIG. 14 is a graph illustrating characteristics of the nitride semiconductor layer according to the embodiment.

FIG. 14 is a graph showing an example of a relationship between an amount of supplied ammonia and a warpage of the substrate at the time of the formation of the GaN layer. The warpage of the substrate takes on a value at a position distant from the center of the substrate 40 by 50 mm. The horizontal axis gives the V/III ratio at the time of the formation of the GaN layer. The vertical axis gives a warpage Wr (μm) of the substrate 40 in which the nitride semiconductor layer (nitride semiconductor device construction) is formed, at room temperature.

If the warpage Wr is positive in value, it means downward convex (concave-shaped warpage), corresponding to a state where tensile stress SS is applied on the nitride semiconductor layer (and the functional layer 10). If the warpage Wr is negative in value, it means upward convex (convex-shaped warpage), corresponding to a state where compressive stress CS is applied on the nitride semiconductor layer (and the functional layer 10).

As shown in FIG. 14, if the V/III ratio is 980 or 1950, concave-shaped warpage occurs with the warpage Wr of about 220 μm. At this time, cracks occurred in the surface of the nitride semiconductor device. This is because the thickness required to maintain the formation of compressive strain (stress) in the GaN layer is small, as described with reference to FIG. 3. Under those conditions, a total sum of the compressive strain (stress) formed in the GaN layer at the time of the formation of the GaN layer is smaller than tensile strain (stress) that occurs due to a difference in thermal expansion coefficient between the silicon substrate 40 and the nitride semiconductor layer. As a result, concave-shaped warpage occurs to give rise to cracks.

As shown in FIG. 14, as the ammonia supply amount increases, that is, the V/III ratio increases, the concave-shaped warpage Wr decreases to make a change to convex-shaped warpage. This is considered because as the V/III increased, compressive strain (stress) in the GaN layer was accumulated increasingly. If the V/III ratio is not less than 3900, a nitride semiconductor device free of cracks was obtained.

On the other hand, although not shown, in a case where the V/III ratio was increased to 9800, compressive stress was accumulated excessively to give rise to defects in the silicon substrate 40 during the growth of nitride semiconductor layers.

In the embodiment, the V/III ratio is set to, for example, not less than 2000 and not more than 8000. This allows a nitride semiconductor layer (nitride semiconductor device) in which crack occurrence is inhibited to be obtained.

In such a manner, it is found that there is a close relationship between the ammonia supply amount and the nitride semiconductor device's warpage at the time of the formation of the GaN layer.

Moreover, by changing the partial pressure of ammonia at the time of forming the GaN layers (first upper layer 61b, second upper layer 62b, etc.) other than the n-type GaN layer, an experiment was conducted to form the similar nitride semiconductor device as follows.

The GaN layer was formed by using TMGa and ammonia in an atmosphere containing nitrogen and hydrogen at a growth pressure of 1013 hPa. A total sum of gases supplied into the reaction chamber was changed to 90 L/min and the supply amount of ammonia gas was changed and then the ratio of the ammonia gas (ammonia's partial pressure) to the supply-gas total sum was changed to 0.11, 0.22, 0.4, and 0.53.

Four specimens having the different ammonia partial pressures Pp ($NH_3$) at the time of formation of the GaN layer were fabricated, to evaluate substrate warpage, cracks, and substrate defects.

Figure 15:
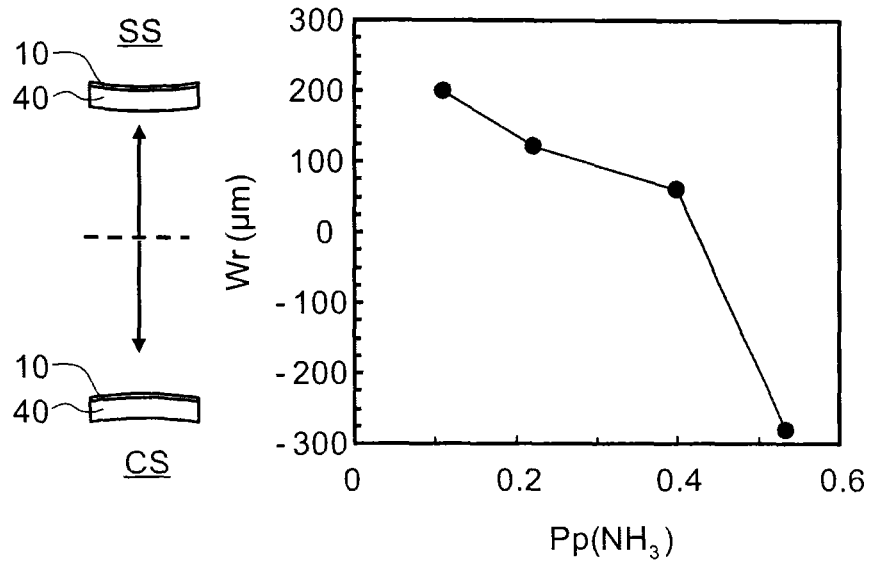
FIG. 15 is a graph showing characteristics of the nitride semiconductor layer according to the embodiment.

FIG. 15 is a graph illustrating characteristics of the nitride semiconductor layer according to the embodiment.

FIG. 15 is a graph illustrating an example of a relationship between the ammonia partial pressure Pp ($NH_3$) at the time of formation of the GaN layer and the warpage Wr (warpage at room temperature) of the nitride semiconductor device.

As shown in FIG. 15, in a case where the ammonia partial pressure Pp ($NH_3$) is 0.11, concave-shaped warpage of about 200 μm was observed to give rise to cracks in the surface of the nitride semiconductor device.

As the ammonia partial pressure Pp ($NH_3$) increased, the concave-shaped warpage was reduced to make a change to convex-shaped warpage. In a case where the ammonia partial pressure Pp ($NH_3$) was not less than 0.22, a nitride semiconductor device free of cracks was obtained. In a case where the ammonia partial pressure Pp ($NH_3$) was 0.53, convex-shaped warpage of about 280 μm was observed; and in a case where the ammonia partial pressure Pp ($NH_3$) was increased further, the convex-shaped warpage expanded due to excessive accumulation of compressive strain (stress), thereby giving rise to defects in the silicon substrate during crystal growth. Excessive accumulation of stress may lead to a decrease in yield in the device process. By keeping the ammonia partial pressure Pp ($NH_3$) not more than 0.5, cracks can be inhibited from being formed in the substrate 40.

In the embodiment, the ammonia partial pressure Pp ($NH_3$) is set to not less than 0.2 and not more than 0.5. This allows a nitride semiconductor layer (nitride semiconductor device) in which crack occurrence is inhibited to be obtained.

By thus controlling the ammonia partial pressure Pp ($NH_3$), it is possible to control the growth mode of the GaN layer. By setting the ratio (ammonia partial pressure) of the ammonia gas to the supply-gas total sum not less than 0.2 and not more than 0.5, it is possible to make the growth rate in a direction parallel to the crystal surface of the GaN layer higher than the growth rate in the stacking direction. This makes it possible to inhibit tensile strain (stress) formed at the time of formation of the GaN layer, and inhibit cracks.

By thus applying the above conditions as the V/III ratio and the ammonia partial pressure, cracks can be inhibited. This is because the growth rate in the direction parallel to the crystal surface of the GaN layer can be made higher than the growth rate in the stacking direction to inhibit tensile strain formed at the time of formation of the GaN layer.

(Third Embodiment)

Figures 16A, 16B, 16C:
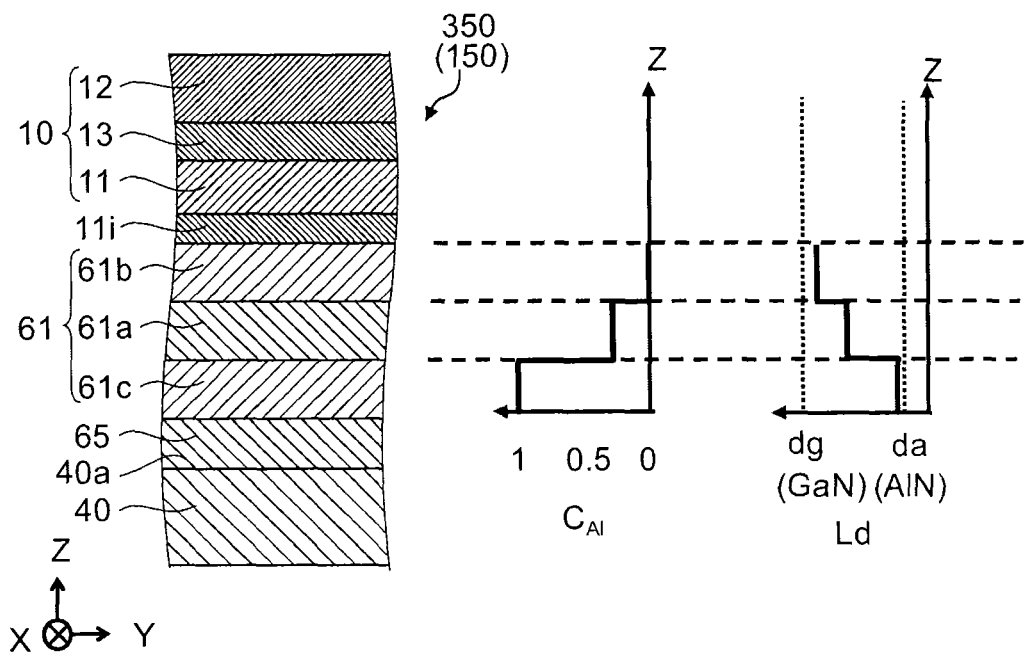
FIG. 16A to FIG. 16C are schematic views showing a nitride semiconductor layer according to a third embodiment.

FIG. 16A to FIG. 16C are schematic views illustrating a nitride semiconductor layer according to a third embodiment.

FIG. 16A is a schematic cross-sectional view illustrating the configuration of a nitride semiconductor layer 350 (nitride semiconductor device 150) according to the embodiment. FIG. 16B illustrates the composition ratio ($C_{Al}$) of Al, FIG. 16C is a graph illustrating a lattice spacing Ld along an a-axis, and FIG. 16D shows a growth temperature GT of the nitride semiconductor layer.

As shown in FIG. 16A, the nitride semiconductor layer 350 (nitride semiconductor device 150) includes an intermediate layer 65 provided on a major surface 40a of a substrate 40 and a first stacked body 61 provided on the intermediate layer 65. The nitride semiconductor layer 350 (nitride semiconductor device 150) may further include a functional layer 10 provided on the first stacked body 61. A GaN layer 11i (for example, an undoped GaN layer 11i) may further be provided on the first stacked layer 61 (for example, between the first stacked body 61 and the functional layer 10).

The first stacked body 61 includes the above first lower layer 61a and the above first upper layer 61b.

The intermediate layer 65 has a lattice spacing along the first axis larger than the above first lattice spacing. As the intermediate layer 65, a nitride semiconductor is used. As the material of the intermediate layer 65, for example, GaN is used. The lattice spacing of the intermediate layer 65 may be the same as the second lattice spacing of the first upper layer 61b.

The first stacked body 61 further includes a first base layer 61c. The first base layer 61c is provided between the intermediate layer 65 and the first lower layer 61a. As the material of the first base layer 61c, $Al_{y1}Ga_{1-y1}N$ ($0<y1\leq1$) is used.

The first lower layer 61a is made of $Al_{x1}Ga_{1-x1}N$ ($0<x1<1$, $x1<y1$). The first upper layer 61b is, for example, a GaN layer.

The Al composition ratio x1 in the first lower layer 61a is not more than a ratio of the absolute value of a difference between a lattice spacing along the axis equivalent to the above first axis of unstrained GaN and an actual lattice spacing along the first axis in the first base layer 61c to the absolute value of a difference between a lattice spacing along the axis equivalent to the above first axis of unstrained GaN and a lattice spacing along the above axis equivalent to the first axis of unstrained $Al_{y1}Ga_{1-y1}N$ ($0<y1\leq1$).

This makes it possible to inhibit tensile strain formed at the time of formation of the GaN layer, and inhibit cracks.

That is, a manufacturing method according to the embodiment can further include a process of forming the to intermediate layer 65 between the major surface 40a and the first stacked body 61a in addition to step S110 and step S120 illustrated in FIG. 2. The manufacturing method can further include a process of forming the first base layer 61c made of $Al_{y1}G_{1-y1}N$ ($0<y1\leq1$) between the intermediate layer 65 and the first lower layer 61a. At this rime, by setting the Al composition ratio x1 in the first lower layer 61a to the above conditions, it is possible to inhibit tensile strain formed at the time of formation of the GaN layer, thereby inhibiting cracks.

In a case where a plurality of stacked bodies are provided on the substrate 40, at least one of the plurality of stacked bodies only needs to have the above configuration including the first lower layer 61a and the first upper layer 61b. As described above, it only needs to have the above configuration including the intermediate layer 65 and the first base layer 61c.

In the embodiment, the method for growing the semiconductor layer may include, for example, metal-organic chemical vapor deposition (MOCVD), metal-organic vapor phase epitaxy (MOPVE), molecular beam epitaxy (MBE), halide vapor phase expitaxy (HYPE), etc.

For example, in a case where the MOCVD or MOVPE method is used, as the materials of the semiconductor layers, the following can be used. As the material of Ga, for example, trimethyl gallium (TMGa) and triethyl gallium (TEGa) can be used. As the material of in, for example, trimethyl indium (TMIn) and triethyl indium (TEIn) can be used. As the material of Al, for example, trimethyl aluminum (TMAl) can be used. As the material of N, for example, ammonia ($NH_3$), monomethyl hydrazine (MMHy), and dimethyl hydrazine (DMHy) can be used. As the material of Si, mono-silane ($SiH_4$) and di-silane ($Si_2H_6$) can be used.

According to the embodiment, it is possible to provide the method for manufacturing a nitride semiconductor layer in which crack occurrence is inhibited.

in the specification, the "nitride semiconductor" includes semiconductors of any composition in which composition ratios x, y, and z in the chemical formula of $B_xIn_yAl_zGa_{1-x-y-z}N$ ($0 \leq x \leq 1$, $0 \leq y \leq 1$, $0 \leq z \leq 1$, $z+y+z \leq 1$) are changed in their respective ranges. Moreover, the "nitride semiconductor" includes also those further containing a group-V element other than nitrogen (N), those further containing various elements added to control various solid state properties such as conductivity types, and those further containing various elements without being intended.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the embodiments of the invention have been described with reference to the specific examples. However, the invention is not limited to those specific examples. For example, the specific configurations of the components such as the substrates, the buffer layers, the stacked bodies, the upper layers, the lower layers, the base layers, and the functional layers contained in the nitride semiconductor layer or the nitride semiconductor device are to be within the scope of the invention as long as those skilled in the art can obtain the same effects by carrying out the invention by appropriately select them from a publicly known scope.

Further, any two or more components of the specific examples may be combined within the extent of technical feasibility and are included in the scope of the invention to the extent that the purport of the invention is included.

Moreover, all methods for manufacturing a nitride semiconductor layer practicable by an appropriate design modification by one skilled in the art based on the method for manufacturing the nitride semiconductor layer described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nitride semiconductor layer, comprising:
   forming a first lower layer of a nitride semiconductor on a major surface of a substrate and forming a first upper layer of a nitride semiconductor on the first lower layer to form a first stacked body including the first lower layer and the first upper layer, the first lower layer having a first lattice spacing along a first axis parallel to the major surface, the first upper layer having a second lattice spacing along the first axis larger than the first lattice spacing, at least a part of the first upper layer having a first compressive strain along the major surface,
   an absolute value of a ratio of a difference between the second lattice spacing and the first lattice spacing to the first lattice spacing being not less than 0.005 and not more than 0.019, and
   the forming the first upper layer including
      making a growth rate of the first upper layer in a direction parallel to the major surface larger than a growth rate of the first upper layer in a direction perpendicular to the major surface, and
      forming the first upper layer while applying the first compressive strain on the first upper layer, the first compressive strain being based on the difference between the second lattice spacing and the first lattice spacing, wherein
   the second lattice spacing of the first upper layer after formation of the first stacked body has a value between an unstrained lattice constant of the first upper layer and an unstrained lattice constant of a first base layer located between the first lower layer and the substrate.

2. The method according to claim 1, wherein a ratio of a number of atoms of a group-V element supplied for a unit time to a number of atoms of a group-III element supplied for the unit time in the forming the first upper layer is not less than 2000 and not more than 8000.

3. The method according to claim 1, wherein a ratio of a flow rate of an ammonia gas to a flow rate of a total sum of a supply gas in the forming the first upper layer is not less than 0.2 and not more than 0.5.

4. The method according to claim 1, wherein a thickness of the first upper layer is not less than 250 nanometers.

5. The method according to claim 1, wherein
the forming the first stacked body includes the first base layer of a nitride semiconductor on the major surface before the forming the first lower layer, and the first base layer has a lattice spacing along the first axis smaller than the first lattice spacing.

6. The method according to claim 5, wherein
the first base layer is made of AlN,
the first lower layer is made of $Al_{x1}Ga_{1-x1}N$ ($0<x1<1$), and
the first upper layer is made of GaN.

7. The method according to claim 6, wherein
the Al composition ratio x1 in the first lower layer is not less than 0.1 and not more than 0.9.

8. The method according to claim 6, wherein
a thickness of the first lower layer is not less than 100 nanometers and not more than 500 nanometers.

9. The method according to claim 1, wherein
the substrate is a silicon substrate.

10. The method according to claim 1, further comprising forming a second lower layer of a nitride semiconductor on the first stacked body and forming a second upper layer of a nitride semiconductor on the second lower layer to form a second stacked body including the second lower layer and the second upper layer, the second lower having a third lattice spacing along the first axis, the second upper layer having a fourth lattice spacing along the first axis larger than the third lattice spacing, at least a part of the second upper layer having a second compressive strain along the major surface,
an absolute value of a ratio of a difference between the fourth lattice spacing and the third lattice spacing to the third lattice spacing being not less than 0.005 and not more than 0.019, and
the forming the second upper layer including
   making a growth rate of the second upper layer in the direction parallel to the major surface larger than a growth rate of the second upper layer in the direction perpendicular to the major surface, and forming the second upper layer while applying the second compressive strain based on the difference between the fourth lattice spacing and the third lattice spacing on the second upper layer.

11. The method according to claim 10, wherein
the forming the second stacked body includes forming a second base layer of a nitride semiconductor on the first stacked body before the forming the second lower layer, and the second base layer has a lattice spacing along the first axis smaller than the third lattice spacing.

12. The method according to claim 11, wherein
the second base layer is made of AlN,
the second lower layer is made of $Al_{x2}Ga_{1-x2}N$ (0<x2<1), and
the second upper layer is made of GaN.

13. The method according to claim 12, wherein a growth temperature of the second base layer is lower than a growth temperature of the second lower layer and lower than a growth temperature of the second upper layer.

14. The method according to claim 12, wherein a growth temperature of the second base layer is not less than 500° C. and not more than 1050° C.

15. The method according to claim 12, wherein a thickness of the second lower layer is not less than 5 nanometers and not more than 100 nanometers.

16. The method according to claim 11, wherein a thickness of the second upper layer is thicker than a thickness of the first upper layer.

17. The method according to claim 11, wherein the forming the second base layer includes forming the second base layer while applying a tensile stress on the second base layer.

18. The method according to claim 1, further comprising:
forming an intermediate layer of GaN between the major surface and the first stacked body; and
forming a first base layer of $Al_{y1}Ga_{1-y1}N$ (0<y1≤1) between the intermediate layer and the first lower layer,
the first lower layer being made of $Al_{x1}Ga_{1-x1}N$ (0<x1<1, x1<y1), and
the Al composition ratio x1 in the first lower layer being not more than a ratio of an absolute value of a difference between a lattice spacing along an axis equivalent to the first axis of unstrained GaN and a lattice spacing along the first axis in the first base layer to an absolute value of a difference between the lattice spacing along the axis equivalent to the first axis of unstrained GaN and a lattice spacing along the axis equivalent to the first axis of the unstrained $Al_{y1}Ga_{1-y1}N$ (0<y1≤1).

19. The method according to claim 18, wherein the forming the first lower layer includes forming the first lower layer while applying a second compressive strain on the first lower layer, and the second compressive strain along the major surface.

20. The method according to claim 1, further comprising:
forming a second base layer of $Al_{y2}Ga_{1-y2}N$ (0<y2≤1) on the first stacked body, forming a second lower layer of $Al_{x2}Ga_{1-x2}N$ (0<x2<1, x2<y2) on the second base layer, and forming a second upper layer of GaN on the second lower layer to form a second stacked body including the second base layer, the second lower layer and the second upper layer, the second lower layer having a third lattice spacing along the first axis larger than a lattice spacing along the first axis of the second base layer, the second upper layer having a fourth lattice spacing along the first axis larger than the third lattice spacing, at least a part of the second upper layer having compressive strain along the major surface,
an absolute value of a ratio of a difference between the fourth lattice spacing and the third lattice spacing to the third lattice spacing being not less than 0.005 and not more than 0.019,
the forming the second upper layer including
making a growth rate of the second upper layer in the direction parallel to the major surface larger than a growth rate of the second upper layer in the direction perpendicular to the major surface, and
forming the second upper layer while applying compressive strain along the major surface based on the difference between the fourth lattice spacing and the third lattice spacing on the second upper layer,
the first lower layer being made of $Al_{x1}Ga_{1-x1}N$ (0<x1<1);
the first upper layer being made of GaN; and
the Al composition ratio x2 in the second lower layer being not more than a ratio of an absolute value of a difference between a lattice spacing along an axis equivalent to the first axis of unstrained GaN and a lattice spacing along the first axis in the second base layer to an absolute value of a difference between the lattice spacing along the axis equivalent to the first axis of unstrained GaN and a lattice spacing along the axis equivalent to the first axis of the unstrained $Al_{y2}Ga_{1-y2}N$ (0<y2≤1).

* * * * *